United States Patent
Andrews et al.

(10) Patent No.: US 7,535,247 B2
(45) Date of Patent: May 19, 2009

(54) INTERFACE FOR TESTING SEMICONDUCTORS

(75) Inventors: Peter Andrews, Beaverton, OR (US); David Hess, Beaverton, OR (US); Robert New, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 109 days.

(21) Appl. No.: 11/335,037

(22) Filed: Jan. 18, 2006

(65) Prior Publication Data

US 2006/0170441 A1    Aug. 3, 2006

Related U.S. Application Data

(60) Provisional application No. 60/648,747, filed on Jan. 31, 2005.

(51) Int. Cl.
    *G01R 31/00*    (2006.01)
(52) U.S. Cl. ..................................... 324/770
(58) Field of Classification Search ................. None
    See application file for complete search history.

(56) References Cited

U.S. PATENT DOCUMENTS

| | | | |
|---|---|---|---|
| 491,783 A | 2/1893 | Moyer |
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappl |
| 2,545,258 A | 3/1951 | Cailloux |
| 2,762,234 A | 9/1956 | Dodd |
| 2,812,502 A | 11/1957 | Doherty |
| 2,901,696 A | 8/1959 | Möllfors |
| 2,921,276 A | 1/1960 | Fubini |
| 3,176,091 A | 3/1965 | Hanson et al. |
| 3,185,927 A | 5/1965 | Margulis et al. |

(Continued)

FOREIGN PATENT DOCUMENTS

DD    288 234    3/1991

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Jermele M Hollington
(74) *Attorney, Agent, or Firm*—Chernoff, Vilhauer, McClung & Stenzel

(57) ABSTRACT

A system includes an imaging device suitable for effectively positioning a probe for testing a semiconductor wafer. The system includes an objective lens for sensing the device under test and an imaging device sensing a first video sequence including multiple frames of an overlapping region of the device under test. A video signal is provided to a display including multiple frames of the overlapping region of the device under test. An operator indicating a region of the video signal of devices under test and the system in response presenting an enlarged view of a plurality of different regions of the device under test in a plurality of windows free from user input, where the region and the plurality of different regions are simultaneously displayed on the display.

14 Claims, 10 Drawing Sheets

U.S. PATENT DOCUMENTS

| | | |
|---|---|---|
| 3,192,844 A | 7/1965 | Szasz et al. |
| 3,193,712 A | 7/1965 | Harris |
| 3,201,721 A | 8/1965 | Voelcker |
| 3,218,584 A | 11/1965 | Ayer |
| 3,230,299 A | 1/1966 | Radziejowski |
| 3,256,484 A | 6/1966 | Terry |
| 3,262,593 A | 7/1966 | Hainer |
| 3,265,969 A | 8/1966 | Catu |
| 3,289,046 A | 11/1966 | Carr |
| 3,333,274 A | 7/1967 | Forcier |
| 3,396,598 A | 8/1968 | Grispo |
| 3,401,126 A | 9/1968 | Miller et al. |
| 3,405,361 A | 10/1968 | Kattner et al. |
| 3,408,565 A | 10/1968 | Frick et al. |
| 3,429,040 A | 2/1969 | Miller |
| 3,435,185 A | 3/1969 | Gerard |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,602,845 A | 8/1971 | Agrios et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,573 A | 4/1972 | Graham |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,775,644 A | 11/1973 | Cotner et al. |
| 3,777,260 A | 12/1973 | Davies et al. |
| 3,806,801 A | 4/1974 | Bove |
| 3,810,016 A | 5/1974 | Chayka et al. |
| 3,810,017 A | 5/1974 | Wiesler et al. |
| 3,814,888 A | 6/1974 | Bowers et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,862,790 A | 1/1975 | Davies et al. |
| 3,863,181 A | 1/1975 | Glance et al. |
| 3,866,093 A | 2/1975 | Kusters et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,042,119 A | 8/1977 | Hassan et al. |
| 4,049,252 A | 9/1977 | Bell |
| 4,063,195 A | 12/1977 | Abrams et al. |
| 4,066,943 A | 1/1978 | Roch |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly |
| 4,123,706 A | 10/1978 | Roch |
| 4,124,787 A | 11/1978 | Aamoth et al. |
| 4,151,465 A | 4/1979 | Lenz |
| 4,161,692 A | 7/1979 | Tarzwell |
| 4,172,993 A | 10/1979 | Leach |
| 4,177,421 A | 12/1979 | Thornburg |
| 4,184,133 A | 1/1980 | Gehle |
| 4,184,729 A | 1/1980 | Parks et al. |
| 4,186,338 A | 1/1980 | Fichtenbaum |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,340,860 A | 7/1982 | Teeple, Jr. |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,375,631 A | 3/1983 | Goldberg |
| 4,376,920 A | 3/1983 | Smith |
| 4,383,178 A | 5/1983 | Shibata et al. |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,652,082 A | 3/1987 | Warner |
| 4,663,840 A | 5/1987 | Ubbens et al. |
| 4,665,360 A | 5/1987 | Phillips |
| 4,669,805 A | 6/1987 | Kosugi et al. |
| 4,673,839 A | 6/1987 | Veenendaal |
| 4,675,600 A | 6/1987 | Gergin |

| | | | | | |
|---|---|---|---|---|---|
| 4,680,538 A | 7/1987 | Dalman et al. | 4,884,206 A | 11/1989 | Mate |
| 4,684,883 A | 8/1987 | Ackerman et al. | 4,888,550 A | 12/1989 | Reid |
| 4,684,884 A | 8/1987 | Soderlund | 4,891,584 A | 1/1990 | Kamieniecki et al. |
| 4,685,150 A | 8/1987 | Maier | 4,893,914 A | 1/1990 | Hancock et al. |
| 4,691,831 A | 9/1987 | Suzuki et al. | 4,894,612 A | 1/1990 | Drake et al. |
| 4,694,245 A | 9/1987 | Frommes | 4,896,109 A | 1/1990 | Rauscher |
| 4,695,794 A | 9/1987 | Bargett et al. | 4,899,126 A | 2/1990 | Yamada |
| 4,696,544 A | 9/1987 | Costella | 4,899,998 A | 2/1990 | Feramachi |
| 4,697,143 A | 9/1987 | Lockwood et al. | 4,901,012 A | 2/1990 | Gloanec et al. |
| 4,703,433 A | 10/1987 | Sharrit | 4,904,933 A | 2/1990 | Snyder et al. |
| 4,705,447 A | 11/1987 | Smith | 4,904,935 A | 2/1990 | Calma et al. |
| 4,706,050 A | 11/1987 | Andrews | 4,906,920 A | 3/1990 | Huff et al. |
| 4,707,657 A | 11/1987 | Bøegh-Petersen | 4,908,570 A | 3/1990 | Gupta et al. |
| 4,711,563 A | 12/1987 | Lass | 4,912,399 A | 3/1990 | Greub et al. |
| 4,712,370 A | 12/1987 | MacGee | 4,916,002 A | 4/1990 | Carver |
| 4,714,873 A | 12/1987 | McPherson et al. | 4,916,398 A | 4/1990 | Rath |
| 4,727,319 A | 2/1988 | Shahriary | 4,918,279 A | 4/1990 | Babel et al. |
| 4,727,391 A | 2/1988 | Tajima et al. | 4,918,373 A | 4/1990 | Newberg |
| 4,727,637 A | 3/1988 | Buckwitz et al. | 4,918,374 A | 4/1990 | Stewart et al. |
| 4,730,158 A | 3/1988 | Kasai et al. | 4,918,383 A | 4/1990 | Huff et al. |
| 4,731,577 A | 3/1988 | Logan | 4,922,186 A | 5/1990 | Tsuchiya et al. |
| 4,734,641 A | 3/1988 | Byrd, Jr. et al. | 4,922,912 A | 5/1990 | Watanabe |
| 4,734,872 A | 3/1988 | Eager et al. | 4,923,407 A | 5/1990 | Rice et al. |
| 4,739,259 A | 4/1988 | Hadwin et al. | 4,926,118 A | 5/1990 | O'Connor et al. |
| 4,740,764 A | 4/1988 | Gerlack | 4,926,172 A | 5/1990 | Gorsek |
| 4,744,041 A | 5/1988 | Strunk et al. | 4,933,634 A | 6/1990 | Cuzin et al. |
| 4,746,857 A | 5/1988 | Sakai et al. | 4,968,931 A | 11/1990 | Littlebury et al. |
| 4,749,942 A | 6/1988 | Sang et al. | 4,970,386 A | 11/1990 | Buck |
| 4,755,746 A | 7/1988 | Mallory et al. | 4,972,073 A | 11/1990 | Lessing |
| 4,755,872 A | 7/1988 | Bestler et al. | 4,975,638 A | 12/1990 | Evans et al. |
| 4,755,874 A | 7/1988 | Esrig et al. | 4,978,907 A | 12/1990 | Smith |
| 4,757,255 A | 7/1988 | Margozzi | 4,978,914 A | 12/1990 | Akimoto et al. |
| 4,757,550 A | 7/1988 | Uga | 4,980,637 A | 12/1990 | Huff et al. |
| 4,758,785 A | 7/1988 | Rath | 4,982,153 A | 1/1991 | Collins et al. |
| 4,759,712 A | 7/1988 | Demand | 4,983,910 A | 1/1991 | Majidi-Ahy et al. |
| 4,764,723 A | 8/1988 | Strid | 4,987,100 A | 1/1991 | McBride et al. |
| 4,771,234 A | 9/1988 | Cook et al. | 4,988,062 A | 1/1991 | London |
| 4,772,846 A | 9/1988 | Reeds | 4,991,290 A | 2/1991 | MacKay |
| 4,777,434 A | 10/1988 | Miller et al. | 4,994,737 A | 2/1991 | Carlton et al. |
| 4,780,670 A | 10/1988 | Cherry | 4,998,062 A | 3/1991 | Ikeda |
| 4,783,625 A | 11/1988 | Harry et al. | 4,998,063 A | 3/1991 | Miller |
| 4,784,213 A | 11/1988 | Eager et al. | 5,001,423 A | 3/1991 | Abrami et al. |
| 4,786,867 A | 11/1988 | Yamatsu | 5,003,253 A | 3/1991 | Majidi-Ahy et al. |
| 4,787,752 A | 11/1988 | Fraser et al. | 5,006,796 A | 4/1991 | Burton et al. |
| 4,788,851 A | 12/1988 | Brault | 5,010,296 A | 4/1991 | Okada et al. |
| 4,791,363 A | 12/1988 | Logan | 5,019,692 A | 5/1991 | Nbedi et al. |
| 4,793,814 A | 12/1988 | Zifcak et al. | 5,020,219 A | 6/1991 | Leedy |
| 4,795,962 A | 1/1989 | Yanagawa et al. | 5,021,186 A | 6/1991 | Ota et al. |
| 4,805,627 A | 2/1989 | Klingenbeck et al. | 5,030,907 A | 7/1991 | Yih et al. |
| 4,810,981 A | 3/1989 | Herstein | 5,034,688 A | 7/1991 | Moulene et al. |
| 4,812,754 A | 3/1989 | Tracy et al. | 5,041,782 A | 8/1991 | Marzan |
| 4,816,767 A | 3/1989 | Cannon et al. | 5,045,781 A | 9/1991 | Gleason et al. |
| 4,818,059 A | 4/1989 | Kakii et al. | 5,051,825 A | 9/1991 | Cochran et al. |
| 4,818,169 A | 4/1989 | Schram et al. | 5,059,898 A | 10/1991 | Barsotti et al. |
| 4,827,211 A | 5/1989 | Strid et al. | 5,061,192 A | 10/1991 | Chapin et al. |
| 4,835,495 A | 5/1989 | Simonutti | 5,061,823 A | 10/1991 | Carroll |
| 4,837,507 A | 6/1989 | Hechtman | 5,065,089 A | 11/1991 | Rich |
| 4,838,802 A | 6/1989 | Soar | 5,065,092 A | 11/1991 | Sigler |
| 4,839,587 A | 6/1989 | Flatley et al. | 5,066,357 A | 11/1991 | Smyth, Jr. et al. |
| 4,845,426 A | 7/1989 | Nolan et al. | 5,069,628 A | 12/1991 | Crumly |
| 4,849,689 A | 7/1989 | Gleason et al. | 5,070,297 A | 12/1991 | Kwon et al. |
| 4,853,613 A | 8/1989 | Sequeira et al. | 5,077,523 A | 12/1991 | Blanz |
| 4,853,624 A | 8/1989 | Rabjohn | 5,084,671 A | 1/1992 | Miyata et al. |
| 4,853,627 A | 8/1989 | Gleason et al. | 5,089,774 A | 2/1992 | Nakano |
| 4,856,426 A | 8/1989 | Wirz | 5,091,691 A | 2/1992 | Kamieniecki et al. |
| 4,856,904 A | 8/1989 | Akagawa | 5,091,692 A | 2/1992 | Ohno et al. |
| 4,858,160 A | 8/1989 | Strid et al. | 5,095,891 A | 3/1992 | Reitter |
| 4,859,989 A | 8/1989 | McPherson | 5,097,101 A | 3/1992 | Trobough |
| 4,864,227 A | 9/1989 | Sato | 5,097,207 A | 3/1992 | Blanz |
| 4,871,883 A | 10/1989 | Guiol | 5,101,149 A | 3/1992 | Adams et al. |
| 4,871,964 A | 10/1989 | Boll et al. | 5,101,453 A | 3/1992 | Rumbaugh |
| 4,871,965 A | 10/1989 | Elbert et al. | 5,103,169 A | 4/1992 | Heaton et al. |
| 4,884,026 A | 11/1989 | Hayakawa et al. | 5,105,148 A | 4/1992 | Lee |

| | | | | | |
|---|---|---|---|---|---|
| 5,105,181 A | 4/1992 | Ross | 5,373,231 A | 12/1994 | Boll et al. |
| 5,107,076 A | 4/1992 | Bullock et al. | 5,376,790 A | 12/1994 | Linker et al. |
| 5,116,180 A | 5/1992 | Fung et al. | 5,382,898 A | 1/1995 | Subramanian |
| 5,126,286 A | 6/1992 | Chance | 5,383,787 A | 1/1995 | Switky et al. |
| 5,126,696 A | 6/1992 | Grote et al. | 5,389,885 A | 2/1995 | Swart |
| 5,133,119 A | 7/1992 | Afshari et al. | 5,395,253 A | 3/1995 | Crumly |
| 5,134,365 A | 7/1992 | Okubo et al. | 5,397,855 A | 3/1995 | Ferlier |
| 5,136,237 A | 8/1992 | Smith et al. | 5,404,111 A | 4/1995 | Mori et al. |
| 5,138,289 A | 8/1992 | McGrath | 5,408,189 A | 4/1995 | Swart et al. |
| 5,142,224 A | 8/1992 | Smith et al. | 5,410,259 A | 4/1995 | Fujihara et al. |
| 5,144,228 A | 9/1992 | Sorna et al. | 5,412,330 A | 5/1995 | Ravel et al. |
| 5,145,552 A | 9/1992 | Yoshizawa et al. | 5,412,866 A | 5/1995 | Woith et al. |
| 5,148,131 A | 9/1992 | Amboss et al. | 5,414,565 A | 5/1995 | Sullivan et al. |
| 5,159,264 A | 10/1992 | Anderson | 5,422,574 A | 6/1995 | Kister |
| 5,159,267 A | 10/1992 | Anderson | 5,430,813 A | 7/1995 | Anderson et al. |
| 5,159,752 A | 11/1992 | Mahant-Shetti et al. | 5,434,512 A | 7/1995 | Schwindt et al. |
| 5,160,883 A | 11/1992 | Blanz | 5,441,690 A | 8/1995 | Ayala-Esquilin et al. |
| 5,164,661 A | 11/1992 | Jones | 5,451,884 A | 9/1995 | Sauerland |
| 5,166,606 A | 11/1992 | Blanz | 5,453,404 A | 9/1995 | Leedy |
| 5,172,049 A | 12/1992 | Kiyokawa et al. | 5,457,398 A | 10/1995 | Schwindt et al. |
| 5,172,050 A | 12/1992 | Swapp | 5,461,328 A | 10/1995 | Devereaux et al. |
| 5,172,051 A | 12/1992 | Zamborelli | 5,463,324 A | 10/1995 | Wardwell et al. |
| 5,177,438 A | 1/1993 | Littlebury et al. | 5,467,024 A | 11/1995 | Swapp |
| 5,180,977 A | 1/1993 | Huff | 5,469,324 A | 11/1995 | Henderson et al. |
| 5,198,752 A | 3/1993 | Miyata et al. | 5,475,316 A | 12/1995 | Hurley et al. |
| 5,198,753 A | 3/1993 | Hamburgen | 5,476,211 A | 12/1995 | Khandros |
| 5,198,756 A | 3/1993 | Jenkins et al. | 5,477,011 A | 12/1995 | Singles et al. |
| 5,198,758 A | 3/1993 | Iknaian et al. | 5,479,108 A | 12/1995 | Cheng |
| 5,202,558 A | 4/1993 | Barker | 5,479,109 A | 12/1995 | Lau et al. |
| 5,202,648 A | 4/1993 | McCandless | 5,481,196 A | 1/1996 | Nosov |
| 5,207,585 A | 5/1993 | Byrnes et al. | 5,481,936 A | 1/1996 | Yanagisawa |
| 5,209,088 A | 5/1993 | Vaks | 5,486,975 A | 1/1996 | Shamouillan et al. |
| 5,210,485 A | 5/1993 | Kreiger et al. | 5,487,999 A | 1/1996 | Farnworth |
| 5,214,243 A | 5/1993 | Johnson | 5,488,954 A | 2/1996 | Sleva et al. |
| 5,214,374 A | 5/1993 | St. Onge | 5,491,426 A | 2/1996 | Small |
| 5,218,185 A | 6/1993 | Gross | 5,493,070 A | 2/1996 | Habu |
| 5,220,277 A | 6/1993 | Reitinger | 5,493,236 A | 2/1996 | Ishii et al. |
| 5,221,905 A | 6/1993 | Bhangu et al. | 5,500,606 A | 3/1996 | Holmes |
| 5,225,037 A | 7/1993 | Eldu et al. | 5,505,150 A | 4/1996 | James et al. |
| 5,225,796 A | 7/1993 | Williams et al. | 5,506,515 A | 4/1996 | Godshalk et al. |
| 5,232,789 A | 8/1993 | Platz et al. | 5,507,652 A | 4/1996 | Wardwell |
| 5,233,197 A | 8/1993 | Bowman et al. | 5,508,631 A | 4/1996 | Manku et al. |
| 5,237,267 A | 8/1993 | Harwood et al. | 5,510,792 A | 4/1996 | Ono et al. |
| 5,266,889 A | 11/1993 | Harwood et al. | 5,511,010 A | 4/1996 | Burns |
| 5,266,963 A | 11/1993 | Carter | 5,515,167 A | 5/1996 | Ledger et al. |
| 5,267,088 A | 11/1993 | Nomura | 5,517,111 A | 5/1996 | Shelor |
| 5,270,664 A | 12/1993 | McMurty et al. | 5,517,126 A | 5/1996 | Yamaguchi |
| 5,274,336 A | 12/1993 | Crook et al. | 5,521,518 A | 5/1996 | Higgins |
| 5,278,494 A | 1/1994 | Obigane | 5,521,522 A | 5/1996 | Abe et al. |
| 5,280,156 A | 1/1994 | Niori et al. | 5,523,694 A | 6/1996 | Cole, Jr. |
| 5,289,117 A | 2/1994 | Van Loan et al. | 5,530,371 A | 6/1996 | Perry et al. |
| 5,293,175 A | 3/1994 | Hemmie et al. | 5,530,372 A | 6/1996 | Lee et al. |
| 5,298,972 A | 3/1994 | Heffner | 5,531,022 A | 7/1996 | Beaman et al. |
| 5,303,938 A | 4/1994 | Miller et al. | 5,532,608 A | 7/1996 | Behfar-Rad et al. |
| 5,313,157 A | 5/1994 | Pasiecznik, Jr. | 5,532,609 A | 7/1996 | Harwood et al. |
| 5,315,237 A | 5/1994 | Iwakura et al. | 5,537,372 A | 7/1996 | Albrecht et al. |
| 5,316,435 A | 5/1994 | Monzingo | 5,539,323 A | 7/1996 | Davis, Jr. |
| 5,317,656 A | 5/1994 | Moslehi et al. | 5,546,012 A | 8/1996 | Perry et al. |
| 5,321,352 A | 6/1994 | Takebuchi | 5,550,480 A | 8/1996 | Nelson et al. |
| 5,321,453 A | 6/1994 | Mori et al. | 5,550,481 A | 8/1996 | Holmes et al. |
| 5,325,052 A | 6/1994 | Yamashita | 5,550,482 A | 8/1996 | Sano |
| 5,326,412 A | 7/1994 | Schreiber et al. | 5,552,716 A | 9/1996 | Takahashi et al. |
| 5,334,931 A | 8/1994 | Clarke et al. | 5,561,377 A | 10/1996 | Strid et al. |
| 5,336,989 A | 8/1994 | Hofer | 5,561,585 A | 10/1996 | Barnes et al. |
| 5,345,170 A | 9/1994 | Schwindt et al. | 5,565,788 A | 10/1996 | Burr et al. |
| 5,347,204 A | 9/1994 | Gregory et al. | 5,571,324 A | 11/1996 | Sago et al. |
| 5,355,079 A | 10/1994 | Evans et al. | 5,572,398 A | 11/1996 | Federlin et al. |
| 5,360,312 A | 11/1994 | Mozingo | 5,578,932 A | 11/1996 | Adamian |
| 5,361,049 A | 11/1994 | Rubin et al. | 5,583,445 A | 12/1996 | Mullen |
| 5,367,165 A | 11/1994 | Toda et al. | 5,584,120 A | 12/1996 | Roberts |
| 5,369,370 A | 11/1994 | Stratmann et al. | 5,589,781 A | 12/1996 | Higgens et al. |
| 5,371,457 A | 12/1994 | Lipp | 5,594,358 A | 1/1997 | Ishikawa et al. |
| 5,371,654 A | 12/1994 | Beaman et al. | 5,601,740 A | 2/1997 | Eldridge et al. |

| | | | | | |
|---|---|---|---|---|---|
| 5,604,444 A | 2/1997 | Harwood et al. | 5,821,763 A | 10/1998 | Beaman et al. |
| 5,610,529 A | 3/1997 | Schwindt | 5,828,225 A | 10/1998 | Obikane et al. |
| 5,611,008 A | 3/1997 | Yap | 5,829,128 A | 11/1998 | Eldridge et al. |
| 5,611,946 A | 3/1997 | Leong et al. | 5,829,437 A | 11/1998 | Bridges |
| 5,617,035 A | 4/1997 | Swapp | 5,831,442 A | 11/1998 | Heigl |
| 5,621,333 A | 4/1997 | Long et al. | 5,832,601 A | 11/1998 | Eldridge et al. |
| 5,621,400 A | 4/1997 | Corbi | 5,835,997 A | 11/1998 | Yassine |
| 5,623,213 A | 4/1997 | Liu et al. | 5,838,160 A | 11/1998 | Beaman et al. |
| 5,623,214 A | 4/1997 | Pasiecznik, Jr. | 5,838,161 A | 11/1998 | Akram et al. |
| 5,627,473 A | 5/1997 | Takami | 5,841,288 A | 11/1998 | Meaney et al. |
| 5,629,631 A | 5/1997 | Perry et al. | 5,841,342 A | 11/1998 | Hegmann et al. |
| 5,631,571 A | 5/1997 | Spaziani et al. | 5,847,569 A | 12/1998 | Ho et al. |
| 5,633,780 A | 5/1997 | Cronin | 5,848,500 A | 12/1998 | Kirk |
| 5,635,846 A | 6/1997 | Beaman et al. | 5,852,871 A | 12/1998 | Khandros |
| 5,640,101 A | 6/1997 | Kuji et al. | 5,857,667 A | 1/1999 | Lee |
| 5,642,298 A | 6/1997 | Mallory et al. | 5,861,743 A | 1/1999 | Pye et al. |
| 5,644,248 A | 7/1997 | Fujimoto | 5,864,946 A | 2/1999 | Eldridge et al. |
| 5,646,538 A | 7/1997 | Lide et al. | 5,869,974 A | 2/1999 | Akram et al. |
| 5,656,942 A | 8/1997 | Watts et al. | 5,869,975 A | 2/1999 | Strid et al. |
| 5,657,394 A | 8/1997 | Schwartz et al. | 5,874,361 A | 2/1999 | Collins et al. |
| 5,659,255 A | 8/1997 | Strid et al. | 5,876,082 A | 3/1999 | Kempf et al. |
| 5,659,421 A | 8/1997 | Rahmel et al. | 5,878,486 A | 3/1999 | Eldridge et al. |
| 5,663,653 A | 9/1997 | Schwindt et al. | 5,879,289 A | 3/1999 | Yarush et al. |
| 5,666,063 A | 9/1997 | Abercrombie et al. | 5,880,772 A | 3/1999 | Kalnajs et al. |
| 5,668,470 A | 9/1997 | Shelor | 5,883,522 A | 3/1999 | O'Boyle |
| 5,669,316 A | 9/1997 | Faz et al. | 5,883,523 A | 3/1999 | Ferland et al. |
| 5,670,888 A | 9/1997 | Cheng | 5,884,398 A | 3/1999 | Eldridge et al. |
| 5,672,816 A | 9/1997 | Park et al. | 5,892,539 A | 4/1999 | Colvin |
| 5,675,499 A | 10/1997 | Lee et al. | 5,896,038 A | 4/1999 | Budnaitis et al. |
| 5,675,932 A | 10/1997 | Mauney | 5,900,737 A | 5/1999 | Graham et al. |
| 5,676,360 A | 10/1997 | Boucher et al. | 5,900,738 A | 5/1999 | Khandros et al. |
| 5,680,039 A | 10/1997 | Mochizuki et al. | 5,903,143 A | 5/1999 | Mochizuki et al. |
| 5,682,337 A | 10/1997 | El-Fishaway et al. | 5,905,421 A | 5/1999 | Oldfield |
| 5,685,232 A | 11/1997 | Inoue | 5,910,727 A | 6/1999 | Fujihara et al. |
| 5,686,317 A | 11/1997 | Akram et al. | 5,912,046 A | 6/1999 | Eldridge et al. |
| 5,688,618 A | 11/1997 | Hulderman et al. | 5,914,613 A | 6/1999 | Gleason et al. |
| 5,700,844 A | 12/1997 | Hederick et al. | 5,914,614 A | 6/1999 | Beaman et al. |
| 5,704,355 A | 1/1998 | Bridges | 5,916,689 A | 6/1999 | Collins et al. |
| 5,712,571 A | 1/1998 | O'Donoghue | 5,917,707 A | 6/1999 | Khandros et al. |
| 5,715,819 A | 2/1998 | Svenson et al. | 5,923,177 A | 7/1999 | Wardwell |
| 5,720,098 A | 2/1998 | Kister | 5,923,180 A | 7/1999 | Botka et al. |
| 5,723,347 A | 3/1998 | Kirano et al. | 5,926,029 A | 7/1999 | Ference et al. |
| 5,726,211 A | 3/1998 | Hedrick et al. | 5,926,951 A | 7/1999 | Khandros et al. |
| 5,728,091 A | 3/1998 | Payne et al. | 5,942,907 A | 8/1999 | Chiang |
| 5,729,150 A | 3/1998 | Schwindt | 5,944,093 A | 8/1999 | Viswanath |
| 5,731,708 A | 3/1998 | Sobhami | 5,945,836 A | 8/1999 | Sayre et al. |
| 5,731,920 A | 3/1998 | Katsuragawa | 5,949,579 A | 9/1999 | Baker |
| 5,742,174 A | 4/1998 | Kister et al. | 5,952,842 A | 9/1999 | Fujimoto |
| 5,748,506 A | 5/1998 | Bockelman | 5,959,461 A | 9/1999 | Brown et al. |
| 5,756,021 A | 5/1998 | Bedrick et al. | 5,960,411 A | 9/1999 | Hartman et al. |
| 5,756,908 A | 5/1998 | Knollmeyer et al. | 5,963,027 A | 10/1999 | Peters |
| 5,767,690 A | 6/1998 | Fujimoto | 5,963,364 A | 10/1999 | Leong et al. |
| 5,772,451 A | 6/1998 | Dozier, II et al. | 5,970,429 A | 10/1999 | Martin |
| 5,773,780 A | 6/1998 | Eldridge et al. | 5,973,504 A | 10/1999 | Chong |
| 5,773,951 A | 6/1998 | Markowski et al. | 5,973,505 A | 10/1999 | Strid et al. |
| 5,777,485 A | 7/1998 | Tanaka et al. | 5,974,662 A | 11/1999 | Eldridge et al. |
| 5,785,538 A | 7/1998 | Beaman et al. | 5,982,166 A | 11/1999 | Mautz |
| 5,794,133 A | 8/1998 | Kashima | 5,983,493 A | 11/1999 | Eldridge et al. |
| 5,798,652 A | 8/1998 | Taraci | 5,994,152 A | 11/1999 | Khandros et al. |
| 5,802,856 A | 9/1998 | Schaper et al. | 5,995,914 A | 11/1999 | Cabot |
| 5,803,607 A | 9/1998 | Jones et al. | 5,998,228 A | 12/1999 | Eldridge et al. |
| 5,804,483 A | 9/1998 | Harris | 5,998,768 A | 12/1999 | Hunter et al. |
| 5,804,607 A | 9/1998 | Hedrick et al. | 5,998,864 A | 12/1999 | Khandros et al. |
| 5,804,982 A | 9/1998 | Lo et al. | 5,999,268 A | 12/1999 | Yonezawa et al. |
| 5,804,983 A | 9/1998 | Nakajima et al. | 6,001,760 A | 12/1999 | Katsuda et al. |
| 5,806,181 A | 9/1998 | Khandros et al. | 6,002,263 A | 12/1999 | Peters et al. |
| 5,807,107 A | 9/1998 | Bright et al. | 6,002,426 A | 12/1999 | Back et al. |
| 5,810,607 A | 9/1998 | Shih et al. | 6,006,002 A | 12/1999 | Motok et al. |
| 5,811,751 A | 9/1998 | Leona et al. | 6,013,586 A | 1/2000 | McGhee et al. |
| 5,811,982 A | 9/1998 | Beaman et al. | 6,023,103 A | 2/2000 | Chang et al. |
| 5,813,847 A | 9/1998 | Eroglu et al. | 6,023,209 A | 2/2000 | Faulkner et al. |
| 5,814,847 A | 9/1998 | Shihadeh et al. | 6,028,435 A | 2/2000 | Nikawa |
| 5,820,014 A | 10/1998 | Dozier, II et al. | 6,029,141 A | 2/2000 | Bezos et al. |

| | | | | | | |
|---|---|---|---|---|---|---|
| 6,029,344 | A | 2/2000 | Khandros et al. | 6,215,295 B1 | 4/2001 | Smith, III |
| 6,031,383 | A | 2/2000 | Streib et al. | 6,215,670 B1 | 4/2001 | Khandros |
| 6,031,384 | A | 2/2000 | Streib et al. | 6,218,910 B1 | 4/2001 | Miller |
| 6,032,356 | A | 3/2000 | Eldridge et al. | 6,222,031 B1 | 4/2001 | Wakabayashi et al. |
| 6,033,935 | A | 3/2000 | Dozier, II et al. | 6,222,970 B1 | 4/2001 | Wach et al. |
| 6,034,533 | A | 3/2000 | Tervo et al. | 6,229,327 B1 | 5/2001 | Boll et al. |
| 6,037,785 | A | 3/2000 | Higgins | 6,232,149 B1 | 5/2001 | Dozier, II et al. |
| 6,037,793 | A | 3/2000 | Miyazawa et al. | 6,232,787 B1 | 5/2001 | Lo et al. |
| 6,040,739 | A | 3/2000 | Wedeen et al. | 6,232,788 B1 | 5/2001 | Schwindt et al. |
| 6,042,712 | A | 3/2000 | Mathieu | 6,232,789 B1 | 5/2001 | Schwindt |
| 6,043,563 | A | 3/2000 | Eldridge et al. | 6,232,790 B1 | 5/2001 | Bryan et al. |
| 6,043,667 | A | 3/2000 | Cadwallader et al. | 6,233,613 B1 | 5/2001 | Walker et al. |
| 6,046,599 | A | 4/2000 | Long et al. | 6,236,975 B1 | 5/2001 | Boe et al. |
| 6,049,216 | A | 4/2000 | Yang et al. | 6,236,977 B1 | 5/2001 | Verba et al. |
| 6,049,976 | A | 4/2000 | Khandros | 6,242,803 B1 | 6/2001 | Khandros et al. |
| 6,050,829 | A | 4/2000 | Eldridge et al. | 6,245,692 B1 | 6/2001 | Pearce et al. |
| 6,052,653 | A | 4/2000 | Mazur et al. | 6,246,247 B1 | 6/2001 | Eldridge et al. |
| 6,054,651 | A | 4/2000 | Fogel et al. | 6,252,392 B1 | 6/2001 | Peters |
| 6,054,869 | A | 4/2000 | Hutton et al. | 6,255,126 B1 | 7/2001 | Mathiue et al. |
| 6,059,982 | A | 5/2000 | Palagonia et al. | 6,256,882 B1 | 7/2001 | Gleason et al. |
| 6,060,888 | A | 5/2000 | Blackham et al. | 6,257,319 B1 | 7/2001 | Kainuma et al. |
| 6,060,891 | A | 5/2000 | Hembree et al. | 6,257,564 B1 | 7/2001 | Avneri et al. |
| 6,061,589 | A | 5/2000 | Bridges et al. | 6,259,261 B1 | 7/2001 | Engelking et al. |
| 6,062,879 | A | 5/2000 | Beaman et al. | 6,268,015 B1 | 7/2001 | Mathieu et al. |
| 6,064,213 | A | 5/2000 | Khandros et al. | 6,268,016 B1 | 7/2001 | Bhatt et al. |
| 6,064,217 | A | 5/2000 | Smith | 6,271,673 B1 | 8/2001 | Furuta et al. |
| 6,064,218 | A | 5/2000 | Godfrey et al. | 6,274,823 B1 | 8/2001 | Khandros et al. |
| 6,071,009 | A | 6/2000 | Clyne | 6,275,043 B1 | 8/2001 | Mühlberger et al. |
| 6,078,183 | A | 6/2000 | Cole, Jr. | 6,275,738 B1 | 8/2001 | Kasevich et al. |
| 6,078,500 | A | 6/2000 | Beaman et al. | 6,278,051 B1 | 8/2001 | Peabody |
| 6,090,261 | A | 7/2000 | Mathieu | 6,281,691 B1 | 8/2001 | Matsunaga et al. |
| 6,091,236 | A | 7/2000 | Piety et al. | 6,284,971 B1 | 9/2001 | Atalar et al. |
| 6,091,255 | A | 7/2000 | Godfrey | 6,286,208 B1 | 9/2001 | Shih et al. |
| 6,091,256 | A | 7/2000 | Long et al. | 6,288,557 B1 | 9/2001 | Peters et al. |
| 6,096,567 | A | 8/2000 | Kaplan et al. | 6,292,760 B1 | 9/2001 | Burns |
| 6,104,201 | A | 8/2000 | Beaman et al. | 6,295,729 B1 | 10/2001 | Beaman et al. |
| 6,104,203 | A | 8/2000 | Costello et al. | 6,300,775 B1 | 10/2001 | Peach et al. |
| 6,104,206 | A | 8/2000 | Verkuil | 6,300,780 B1 | 10/2001 | Beaman et al. |
| 6,110,823 | A | 8/2000 | Eldridge et al. | 6,307,161 B1 | 10/2001 | Grube et al. |
| 6,111,419 | A | 8/2000 | Lefever et al. | 6,307,363 B1 | 10/2001 | Anderson |
| 6,114,864 | A | 9/2000 | Soejima et al. | 6,307,672 B1 | 10/2001 | DeNure |
| 6,114,865 | A | 9/2000 | Lagowski et al. | 6,310,483 B1 | 10/2001 | Taura et al. |
| 6,118,287 | A | 9/2000 | Boll et al. | 6,310,755 B1 | 10/2001 | Kholodenko et al. |
| 6,118,894 | A | 9/2000 | Schwartz et al. | 6,313,649 B2 | 11/2001 | Harwood et al. |
| 6,121,783 | A | 9/2000 | Horner et al. | 6,320,372 B1 | 11/2001 | Keller |
| 6,124,723 | A | 9/2000 | Costello | 6,320,396 B1 | 11/2001 | Nikawa |
| 6,124,725 | A | 9/2000 | Sato | 6,327,034 B1 | 12/2001 | Hoover et al. |
| 6,127,831 | A | 10/2000 | Khoury et al. | 6,329,827 B1 | 12/2001 | Beaman et al. |
| 6,130,536 | A | 10/2000 | Powell et al. | 6,330,164 B1 | 12/2001 | Khandros et al. |
| 6,130,544 | A | 10/2000 | Strid et al. | 6,332,270 B2 | 12/2001 | Beaman et al. |
| 6,137,302 | A | 10/2000 | Schwindt | 6,334,247 B1 | 1/2002 | Beaman et al. |
| 6,137,303 | A | 10/2000 | Deckert et al. | 6,335,628 B2 | 1/2002 | Schwindt et al. |
| 6,144,212 | A | 11/2000 | Mizuta | 6,339,338 B1 | 1/2002 | Eldridge et al. |
| 6,147,851 | A | 11/2000 | Anderson | 6,340,895 B1 | 1/2002 | Uher et al. |
| 6,150,186 | A | 11/2000 | Chen et al. | 6,351,885 B2 | 3/2002 | Suzuki et al. |
| 6,160,407 | A | 12/2000 | Nikawa | 6,352,454 B1 | 3/2002 | Kim et al. |
| 6,168,974 | B1 | 1/2001 | Chang et al. | 6,362,636 B1 | 3/2002 | Peters et al. |
| 6,169,410 | B1 | 1/2001 | Grace et al. | 6,380,751 B2 | 4/2002 | Harwood et al. |
| 6,172,337 | B1 | 1/2001 | Johnsgard et al. | 6,384,614 B1 | 5/2002 | Hager et al. |
| 6,174,744 | B1 | 1/2001 | Watanabe et al. | 6,384,615 B2 | 5/2002 | Schwindt |
| 6,175,228 | B1 | 1/2001 | Zamborelli et al. | 6,396,296 B1 | 5/2002 | Tarter et al. |
| 6,181,144 | B1 | 1/2001 | Hembree et al. | 6,396,298 B1 | 5/2002 | Young et al. |
| 6,181,149 | B1 | 1/2001 | Godfrey et al. | 6,400,168 B2 | 6/2002 | Matsunaga et al. |
| 6,181,416 | B1 | 1/2001 | Falk | 6,404,213 B2 | 6/2002 | Noda |
| 6,184,053 | B1 | 2/2001 | Eldridge et al. | 6,407,560 B1 | 6/2002 | Walraven et al. |
| 6,184,587 | B1 | 2/2001 | Khandros et al. | 6,407,562 B1 | 6/2002 | Whiteman |
| 6,191,596 | B1 | 2/2001 | Abiko | 6,415,858 B1 | 7/2002 | Getchel et al. |
| 6,194,907 | B1 | 2/2001 | Kanao et al. | 6,424,141 B1 | 7/2002 | Hollman et al. |
| 6,198,299 | B1 | 3/2001 | Hollman | 6,429,029 B1 | 8/2002 | Eldridge et al. |
| 6,206,273 | B1 | 3/2001 | Beaman et al. | 6,441,315 B1 | 8/2002 | Eldridge et al. |
| 6,208,225 | B1 | 3/2001 | Miller | 6,442,831 B1 | 9/2002 | Khandros et al. |
| 6,211,663 | B1 | 4/2001 | Moulthrop et al. | 6,445,202 B1 | 9/2002 | Cowan et al. |
| 6,215,196 | B1 | 4/2001 | Eldridge et al. | 6,448,788 B1 | 9/2002 | Meaney et al. |

| | | | | | | |
|---|---|---|---|---|---|---|
| 6,448,865 B1 | 9/2002 | Miller | | 6,640,415 B2 | 11/2003 | Eslamy et al. |
| 6,452,406 B1 | 9/2002 | Beaman et al. | | 6,640,432 B1 | 11/2003 | Mathieu et al. |
| 6,452,411 B1 | 9/2002 | Miller et al. | | 6,642,625 B2 | 11/2003 | Dozier, II et al. |
| 6,456,099 B1 | 9/2002 | Eldridge et al. | | 6,642,732 B2 | 11/2003 | Cowan et al. |
| 6,456,103 B1 | 9/2002 | Eldridge et al. | | 6,643,597 B1 | 11/2003 | Dunsmore |
| 6,459,343 B1 | 10/2002 | Miller | | 6,644,982 B1 | 11/2003 | Ondricek et al. |
| 6,459,739 B1 | 10/2002 | Vitenberg | | 6,646,520 B2 | 11/2003 | Miller |
| 6,468,098 B1 | 10/2002 | Eldridge | | 6,655,023 B1 | 12/2003 | Eldridge et al. |
| 6,469,746 B1 | 10/2002 | Maida | | 6,657,455 B2 | 12/2003 | Eldridge et al. |
| 6,475,822 B2 | 11/2002 | Eldridge et al. | | 6,661,316 B2 | 12/2003 | Hreish et al. |
| 6,476,333 B1 | 11/2002 | Khandros et al. | | 6,664,628 B2 | 12/2003 | Khandros et al. |
| 6,476,630 B1 | 11/2002 | Whitten et al. | | 6,669,489 B1 | 12/2003 | Dozier, II et al. |
| 6,479,308 B1 | 11/2002 | Eldridge | | 6,672,875 B1 | 1/2004 | Mathieu et al. |
| 6,480,013 B1 | 11/2002 | Nayler et al. | | 6,677,744 B1 | 1/2004 | Long |
| 6,480,978 B1 | 11/2002 | Roy et al. | | 6,678,850 B2 | 1/2004 | Roy et al. |
| 6,481,939 B1 | 11/2002 | Gillespie et al. | | 6,678,876 B2 | 1/2004 | Stevens et al. |
| 6,482,013 B2 | 11/2002 | Eldridge et al. | | 6,680,659 B2 | 1/2004 | Miller |
| 6,483,327 B1 | 11/2002 | Bruce et al. | | 6,685,817 B1 | 2/2004 | Mathieu |
| 6,483,336 B1 | 11/2002 | Harris et al. | | 6,686,753 B1 | 2/2004 | Kitahata |
| 6,486,687 B2 | 11/2002 | Harwood et al. | | 6,686,754 B2 | 2/2004 | Miller |
| 6,488,405 B1 | 12/2002 | Eppes et al. | | 6,690,185 B1 | 2/2004 | Khandros et al. |
| 6,489,789 B2 | 12/2002 | Peters et al. | | 6,693,518 B2 | 2/2004 | Kumata et al. |
| 6,490,471 B2 | 12/2002 | Svenson et al. | | 6,701,265 B2 | 3/2004 | Hill et al. |
| 6,491,968 B1 | 12/2002 | Mathieu et al. | | 6,701,612 B2 | 3/2004 | Khandros et al. |
| 6,492,822 B2 | 12/2002 | Schwindt et al. | | 6,708,403 B2 | 3/2004 | Beaman et al. |
| 6,496,024 B2 | 12/2002 | Schwindt | | 6,710,265 B2 | 3/2004 | Hills et al. |
| 6,499,121 B1 | 12/2002 | Roy et al. | | 6,710,798 B1 | 3/2004 | Hershel et al. |
| 6,501,289 B1 | 12/2002 | Takekoshi | | 6,713,374 B2 | 3/2004 | Eldridge et al. |
| 6,501,343 B2 | 12/2002 | Miller | | 6,714,828 B2 | 3/2004 | Eldridge et al. |
| 6,509,751 B1 | 1/2003 | Mathieu et al. | | 6,717,426 B2 | 4/2004 | Iwasaki |
| 6,520,778 B1 | 2/2003 | Eldridge et al. | | 6,720,501 B1 | 4/2004 | Henson |
| 6,525,555 B1 | 2/2003 | Khandros et al. | | 6,720,782 B2 | 4/2004 | Schwindt et al. |
| 6,526,655 B2 | 3/2003 | Beaman et al. | | 6,722,032 B2 | 4/2004 | Beaman et al. |
| 6,528,984 B2 | 3/2003 | Beaman et al. | | 6,724,205 B1 | 4/2004 | Hayden et al. |
| 6,528,993 B1 | 3/2003 | Shin et al. | | 6,724,928 B1 | 4/2004 | Davis |
| 6,529,844 B1 | 3/2003 | Kapetanic et al. | | 6,727,579 B1 | 4/2004 | Eldridge et al. |
| 6,534,856 B1 | 3/2003 | Dozier, II et al. | | 6,727,580 B1 | 4/2004 | Eldridge et al. |
| 6,538,214 B2 | 3/2003 | Khandros | | 6,727,716 B1 | 4/2004 | Sharif |
| 6,538,538 B2 | 3/2003 | Hreish et al. | | 6,729,019 B2 | 5/2004 | Grube et al. |
| 6,539,531 B2 | 3/2003 | Miller et al. | | 6,734,687 B1 | 5/2004 | Ishitani et al. |
| 6,549,022 B1 | 4/2003 | Cole, Jr. et al. | | 6,741,085 B1 | 5/2004 | Khandros et al. |
| 6,549,026 B1 | 4/2003 | Dibattista et al. | | 6,741,092 B2 | 5/2004 | Eldridge et al. |
| 6,549,106 B2 | 4/2003 | Martin | | 6,744,268 B2 | 6/2004 | Hollman |
| 6,551,884 B2 | 4/2003 | Masuoka | | 6,753,679 B1 | 6/2004 | Kwong et al. |
| 6,559,671 B2 | 5/2003 | Miller et al. | | 6,759,311 B2 | 7/2004 | Eldridge et al. |
| 6,572,608 B1 | 6/2003 | Lee et al. | | 6,764,869 B2 | 7/2004 | Eldridge |
| 6,573,702 B2 | 6/2003 | Marcuse et al. | | 6,771,090 B2 | 8/2004 | Harris et al. |
| 6,597,187 B2 | 7/2003 | Eldridge et al. | | 6,771,806 B1 | 8/2004 | Satya et al. |
| 6,603,323 B1 | 8/2003 | Miller et al. | | 6,774,651 B1 | 8/2004 | Hembree |
| 6,603,324 B2 | 8/2003 | Eldridge et al. | | 6,777,319 B2 | 8/2004 | Grube et al. |
| 6,605,941 B2 | 8/2003 | Abe | | 6,777,964 B2 | 8/2004 | Navratil et al. |
| 6,605,951 B1 | 8/2003 | Cowan | | 6,778,406 B2 | 8/2004 | Grube et al. |
| 6,605,955 B1 | 8/2003 | Costello et al. | | 6,780,001 B2 | 8/2004 | Eldridge et al. |
| 6,606,014 B2 | 8/2003 | Miller | | 6,784,674 B2 | 8/2004 | Miller |
| 6,606,575 B2 | 8/2003 | Miller | | 6,784,677 B2 | 8/2004 | Miller |
| 6,608,494 B1 | 8/2003 | Bruce et al. | | 6,784,679 B2 | 8/2004 | Sweet et al. |
| 6,608,496 B1 | 8/2003 | Strid et al. | | 6,788,093 B2 | 9/2004 | Aitren et al. |
| 6,611,417 B2 | 8/2003 | Chen | | 6,788,094 B2 | 9/2004 | Khandros et al. |
| 6,615,485 B2 | 9/2003 | Eldridge et al. | | 6,791,176 B2 | 9/2004 | Mathieu et al. |
| 6,616,966 B2 | 9/2003 | Mathieu et al. | | 6,791,344 B2 | 9/2004 | Cook et al. |
| 6,617,862 B1 | 9/2003 | Bruce | | 6,798,225 B2 | 9/2004 | Miller |
| 6,617,866 B1 | 9/2003 | Ickes | | 6,798,226 B2 | 9/2004 | Altmann et al. |
| 6,621,082 B2 | 9/2003 | Morita et al. | | 6,801,047 B2 | 10/2004 | Harwood et al. |
| 6,621,260 B2 | 9/2003 | Eldridge et al. | | 6,806,724 B2 | 10/2004 | Hayden et al. |
| 6,622,103 B1 | 9/2003 | Miller | | 6,807,734 B2 | 10/2004 | Eldridge et al. |
| 6,624,648 B2 | 9/2003 | Eldridge et al. | | 6,811,406 B2 | 11/2004 | Grube |
| 6,624,891 B2 | 9/2003 | Marcus et al. | | 6,812,691 B2 | 11/2004 | Miller |
| 6,627,483 B2 | 9/2003 | Ondricek et al. | | 6,815,963 B2 | 11/2004 | Gleason et al. |
| 6,627,980 B2 | 9/2003 | Eldridge | | 6,816,031 B1 | 11/2004 | Miller |
| 6,628,503 B2 | 9/2003 | Sogard | | 6,816,840 B1 | 11/2004 | Goodwin, III |
| 6,633,174 B1 | 10/2003 | Satya et al. | | 6,817,052 B2 | 11/2004 | Grube |
| 6,636,059 B2 | 10/2003 | Harwood et al. | | 6,818,840 B2 | 11/2004 | Khandros |
| 6,639,415 B2 | 10/2003 | Peters et al. | | 6,822,529 B2 | 11/2004 | Miller |

| | | | | | |
|---|---|---|---|---|---|
| 6,825,052 B2 | 11/2004 | Eldridge et al. | 6,937,037 B2 | 8/2005 | Eldridge et al. |
| 6,825,422 B2 | 11/2004 | Eldridge et al. | 6,937,040 B2 | 8/2005 | Maeda et al. |
| 6,827,582 B2 | 12/2004 | Morris et al. | 6,937,042 B2 | 8/2005 | Yoshida et al. |
| 6,835,898 B2 | 12/2004 | Eldridge et al. | 6,937,045 B2 | 8/2005 | Sinclair |
| 6,836,135 B2 | 12/2004 | Harris et al. | 6,940,264 B2 | 9/2005 | Ryken, Jr. et al. |
| 6,836,962 B2 | 1/2005 | Khandros et al. | 6,940,283 B2 | 9/2005 | McQueeney |
| 6,838,885 B2 | 1/2005 | Kamitani | 6,943,563 B2 | 9/2005 | Martens |
| 6,838,893 B2 | 1/2005 | Khandros et al. | 6,943,571 B2 | 9/2005 | Worledge |
| 6,839,964 B2 | 1/2005 | Henson | 6,943,574 B2 | 9/2005 | Altmann et al. |
| 6,842,024 B2 | 1/2005 | Peters et al. | 6,944,380 B1 | 9/2005 | Hideo et al. |
| 6,843,024 B2 | 1/2005 | Nozaki et al. | 6,946,375 B2 | 9/2005 | Hattori et al. |
| 6,845,491 B2 | 1/2005 | Miller et al. | 6,946,860 B2 | 9/2005 | Cheng et al. |
| 6,847,219 B1 | 1/2005 | Lesher et al. | 6,948,391 B2 | 9/2005 | Brassell et al. |
| 6,850,082 B2 | 2/2005 | Schwindt | 6,948,981 B2 | 9/2005 | Pade |
| 6,856,129 B2 | 2/2005 | Thomas et al. | 7,001,785 B1 | 2/2006 | Chen |
| 6,856,150 B2 | 2/2005 | Sporck et al. | 7,002,133 B2 | 2/2006 | Beausoleil et al. |
| 6,861,856 B2 | 3/2005 | Dunklee et al. | 7,002,363 B2 | 2/2006 | Mathieu |
| 6,862,727 B2 | 3/2005 | Stevens | 7,002,364 B2 | 2/2006 | Kang et al. |
| 6,864,105 B2 | 3/2005 | Grube et al. | 7,003,184 B2 | 2/2006 | Ronnekleiv et al. |
| 6,864,694 B2 | 3/2005 | McTigue | 7,005,842 B2 | 2/2006 | Fink et al. |
| 6,870,381 B2 | 3/2005 | Grube | 7,005,868 B2 | 2/2006 | McTigue |
| 6,873,167 B2 | 3/2005 | Goto et al. | 7,005,879 B1 | 2/2006 | Robertazzi |
| 6,882,239 B2 | 4/2005 | Miller | 7,006,046 B2 | 2/2006 | Aisenbrey |
| 6,882,546 B2 | 4/2005 | Miller | 7,007,380 B2 | 3/2006 | Das et al. |
| 6,885,197 B2 | 4/2005 | Harris et al. | 7,009,188 B2 | 3/2006 | Wang |
| 6,887,723 B1 | 5/2005 | Ondricek et al. | 7,009,383 B2 | 3/2006 | Harwood et al. |
| 6,888,362 B2 | 5/2005 | Eldridge et al. | 7,009,415 B2 | 3/2006 | Kobayashi et al. |
| 6,891,385 B2 | 5/2005 | Miller | 7,011,531 B2 | 3/2006 | Egitto et al. |
| 6,900,646 B2 | 5/2005 | Kasukabe et al. | 7,012,425 B2 | 3/2006 | Shoji |
| 6,900,647 B2 | 5/2005 | Yoshida et al. | 7,012,441 B2 | 3/2006 | Chou et al. |
| 6,900,652 B2 | 5/2005 | Mazur | 7,013,221 B1 | 3/2006 | Friend et al. |
| 6,900,653 B2 | 5/2005 | Yu et al. | 7,014,499 B2 | 3/2006 | Yoon |
| 6,902,416 B2 | 6/2005 | Feldman | 7,015,455 B2 | 3/2006 | Mitsuoka et al. |
| 6,902,941 B2 | 6/2005 | Sun | 7,015,689 B2 | 3/2006 | Kasajima et al. |
| 6,903,563 B2 | 6/2005 | Yoshida et al. | 7,015,690 B2 | 3/2006 | Wang et al. |
| 6,906,506 B1 | 6/2005 | Reano et al. | 7,015,703 B2 | 3/2006 | Hopkins et al. |
| 6,906,539 B2 | 6/2005 | Wilson et al. | 7,015,707 B2 | 3/2006 | Cherian |
| 6,906,542 B2 | 6/2005 | Sakagawa et al. | 7,015,708 B2 | 3/2006 | Beckous et al. |
| 6,906,543 B2 | 6/2005 | Lou et al. | 7,015,709 B2 | 3/2006 | Capps et al. |
| 6,907,149 B2 | 6/2005 | Slater | 7,015,710 B2 | 3/2006 | Yoshida et al. |
| 6,908,364 B2 | 6/2005 | Back et al. | 7,015,711 B2 | 3/2006 | Rothaug et al. |
| 6,909,297 B2 | 6/2005 | Ji et al. | 7,019,541 B2 | 3/2006 | Kittrell |
| 6,909,300 B2 | 6/2005 | Lu et al. | 7,019,544 B1 | 3/2006 | Jacobs et al. |
| 6,909,983 B2 | 6/2005 | Sutherland | 7,020,360 B2 | 3/2006 | Satomura et al. |
| 6,910,268 B2 | 6/2005 | Miller | 7,020,363 B2 | 3/2006 | Johannessen |
| 6,911,814 B2 | 6/2005 | Miller et al. | 7,022,976 B1 | 4/2006 | Santana, Jr. et al. |
| 6,911,826 B2 | 6/2005 | Plotnikov et al. | 7,022,985 B2 | 4/2006 | Knebel et al. |
| 6,911,834 B2 | 6/2005 | Mitchell et al. | 7,023,225 B2 | 4/2006 | Blackwood |
| 6,911,835 B2 | 6/2005 | Chraft et al. | 7,023,226 B2 | 4/2006 | Okumura et al. |
| 6,912,468 B2 | 6/2005 | Marin et al. | 7,023,229 B2 | 4/2006 | Maesaki et al. |
| 6,913,468 B2 | 7/2005 | Dozier, II et al. | 7,023,231 B2 | 4/2006 | Howland, Jr. et al. |
| 6,914,427 B2 | 7/2005 | Gifford et al. | 7,025,628 B2 | 4/2006 | LaMeres et al. |
| 6,914,430 B2 | 7/2005 | Hasegawa et al. | 7,026,832 B2 | 4/2006 | Chaya et al. |
| 6,917,195 B2 | 7/2005 | Hollman | 7,026,833 B2 | 4/2006 | Rincon et al. |
| 6,917,210 B2 | 7/2005 | Miller | 7,026,834 B2 | 4/2006 | Hwang |
| 6,917,211 B2 | 7/2005 | Yoshida et al. | 7,026,835 B2 | 4/2006 | Farnworth et al. |
| 6,917,525 B2 | 7/2005 | Mok et al. | 7,030,599 B2 | 4/2006 | Douglas |
| 6,919,732 B2 | 7/2005 | Yoshida et al. | 7,032,307 B2 | 4/2006 | Matsunaga et al. |
| 6,922,069 B2 | 7/2005 | Jun | 7,034,553 B2 | 4/2006 | Gilboe |
| 6,924,653 B2 | 8/2005 | Schaeffer et al. | 7,035,738 B2 | 4/2006 | Matsumoto et al. |
| 6,924,655 B2 | 8/2005 | Kirby | 7,101,797 B2 | 9/2006 | Yuasa |
| 6,927,078 B2 | 8/2005 | Saijyo et al. | 2001/0002794 A1 | 6/2001 | Draving et al. |
| 6,927,079 B1 | 8/2005 | Fyfield | 2001/0009061 A1 | 7/2001 | Gleason et al. |
| 6,927,586 B2 | 8/2005 | Thiessen | 2001/0009377 A1 | 7/2001 | Schwindt et al. |
| 6,927,587 B2 | 8/2005 | Yoshioka | 2001/0010468 A1 | 8/2001 | Gleason et al. |
| 6,927,598 B2 | 8/2005 | Lee et al. | 2001/0020283 A1 | 9/2001 | Sakaguchi |
| 6,930,498 B2 | 8/2005 | Tervo et al. | 2001/0024116 A1 | 9/2001 | Draving |
| 6,933,713 B2 | 8/2005 | Cannon | 2001/0030549 A1 | 10/2001 | Gleason et al. |
| 6,933,717 B1 | 8/2005 | Dogaru et al. | 2002/0005728 A1 | 1/2002 | Babson et al. |
| 6,933,725 B2 | 8/2005 | Lim et al. | 2002/0008533 A1 | 1/2002 | Ito et al. |
| 6,933,736 B2 | 8/2005 | Kobayashi et al. | 2002/0009377 A1 | 1/2002 | Shafer |
| 6,933,737 B2 | 8/2005 | Sugawara | 2002/0009378 A1 | 1/2002 | Obara |
| 6,937,020 B2 | 8/2005 | Munson et al. | 2002/0011859 A1 | 1/2002 | Smith et al. |

| | | | | | | |
|---|---|---|---|---|---|---|
| 2002/0011863 A1 | 1/2002 | Takahashi et al. | | EP | 0195520 | 9/1986 |
| 2002/0070745 A1 | 6/2002 | Johnson et al. | | EP | 0 201 205 | 12/1986 |
| 2002/0075027 A1 | 6/2002 | Hollman et al. | | EP | 0230348 | 7/1987 |
| 2002/0079911 A1 | 6/2002 | Schwindt | | EP | 0259163 | 3/1988 |
| 2002/0109088 A1* | 8/2002 | Nara et al. ............... 250/306 | | EP | 0259183 | 3/1988 |
| 2002/0118009 A1 | 8/2002 | Hollman et al. | | EP | 0259942 | 3/1988 |
| 2002/0118034 A1 | 8/2002 | Laureanti | | EP | 0261986 | 3/1988 |
| 2002/0180466 A1 | 12/2002 | Hiramatsu et al. | | EP | 0270422 | 6/1988 |
| 2003/0010877 A1 | 1/2003 | Landreville et al. | | EP | 0 314 481 | 5/1989 |
| 2003/0030822 A1 | 2/2003 | Finarov | | EP | 0 333 521 | 9/1989 |
| 2003/0057513 A1 | 3/2003 | Leedy | | EP | 0333521 | 9/1989 |
| 2003/0062915 A1 | 4/2003 | Arnold et al. | | EP | 0 460 911 | 12/1991 |
| 2003/0071631 A1 | 4/2003 | Alexander | | EP | 0460911 | 12/1991 |
| 2003/0088180 A1 | 5/2003 | Van Veen et al. | | EP | 0 505 981 | 9/1992 |
| 2003/0139662 A1 | 7/2003 | Seidman | | EP | 0 574 149 | 12/1993 |
| 2003/0139790 A1 | 7/2003 | Ingle et al. | | EP | 0 706 210 | 4/1996 |
| 2003/0141861 A1 | 7/2003 | Navratil et al. | | EP | 0846476 | 6/1998 |
| 2003/0184332 A1 | 10/2003 | Tomimatsu et al. | | EP | 0 573 183 | 1/1999 |
| 2004/0021475 A1 | 2/2004 | Ito et al. | | EP | 0945736 | 9/1999 |
| 2004/0061514 A1 | 4/2004 | Schwindt et al. | | GB | 579665 | 8/1946 |
| 2004/0066181 A1 | 4/2004 | Theis | | GB | 2014315 | 8/1979 |
| 2004/0075837 A1 | 4/2004 | Maeda et al. | | GB | 2179458 | 3/1987 |
| 2004/0095145 A1 | 5/2004 | Boudiaf et al. | | GB | 2 197 081 | 5/1988 |
| 2004/0095641 A1 | 5/2004 | Russum et al. | | JP | 52-19046 | 2/1977 |
| 2004/0100276 A1 | 5/2004 | Fanton | | JP | 53037077 | 4/1978 |
| 2004/0100297 A1 | 5/2004 | Tanioka et al. | | JP | 53-052354 | 5/1978 |
| 2004/0113639 A1 | 6/2004 | Dunklee et al. | | JP | 55115383 | 9/1980 |
| 2004/0113640 A1 | 6/2004 | Cooper et al. | | JP | 56-007439 | 1/1981 |
| 2004/0134899 A1 | 7/2004 | Hiramatsu et al. | | JP | 5691503 | 7/1981 |
| 2004/0162689 A1 | 8/2004 | Jamneala et al. | | JP | 56088333 | 7/1981 |
| 2004/0193382 A1 | 9/2004 | Adamian et al. | | JP | 57075480 | 5/1982 |
| 2004/0199350 A1 | 10/2004 | Blackham et al. | | JP | 57163035 | 10/1982 |
| 2004/0201388 A1 | 10/2004 | Barr | | JP | 57171805 | 10/1982 |
| 2004/0207072 A1 | 10/2004 | Hiramatsu et al. | | JP | 58-130602 | 8/1983 |
| 2004/0207424 A1 | 10/2004 | Hollman | | JP | 594189 U | 1/1984 |
| 2004/0246004 A1 | 12/2004 | Heuermann | | JP | 60-5462 | 4/1984 |
| 2004/0251922 A1 | 12/2004 | Martens et al. | | JP | 61142802 | 6/1986 |
| 2005/0024069 A1 | 2/2005 | Hayden et al. | | JP | 62-011243 | 1/1987 |
| 2005/0030047 A1 | 2/2005 | Adamian | | JP | 62098634 | 5/1987 |
| 2005/0062533 A1 | 3/2005 | Vice | | JP | 62107937 | 5/1987 |
| 2005/0099192 A1 | 5/2005 | Dunklee et al. | | JP | 62239050 | 10/1987 |
| 2005/0227503 A1 | 10/2005 | Reitinger | | JP | 6229374 | 12/1987 |
| 2006/0030060 A1* | 2/2006 | Noguchi et al. ............. 324/765 | | JP | 63-143814 | 6/1988 |
| 2006/0114012 A1 | 6/2006 | Reitinger | | JP | 63-160355 | 7/1988 |
| 2006/0158207 A1 | 7/2006 | Reitinger | | JP | 1-165968 | 6/1989 |
| 2006/0184041 A1* | 8/2006 | Andrews et al. ............. 600/476 | | JP | 1-178872 | 7/1989 |
| | | | | JP | 1-209380 | 8/1989 |
| | FOREIGN PATENT DOCUMENTS | | | JP | 1-214038 | 8/1989 |
| DD | 2288234 | 3/1991 | | JP | 01209380 | 8/1989 |
| DE | 29 12 826 | 10/1980 | | JP | 1-219575 | 9/1989 |
| DE | 2951072 | 7/1981 | | JP | 1-296167 | 11/1989 |
| DE | 31 14 466 | 3/1982 | | JP | 2-22837 | 1/1990 |
| DE | 31 25 552 | 11/1982 | | JP | 2-22873 | 1/1990 |
| DE | 3426565 | 1/1986 | | JP | 02124469 | 5/1990 |
| DE | 3637549 | 5/1988 | | JP | 02135804 | 5/1990 |
| DE | 41 09 908 | 10/1992 | | JP | 2-220453 | 9/1990 |
| DE | 4223658 | 1/1993 | | JP | 3-67187 | 3/1991 |
| DE | 9313420 | 10/1993 | | JP | 3-175367 | 7/1991 |
| DE | 93 13 420.7 | 12/1993 | | JP | 3196206 | 8/1991 |
| DE | 43 16 111 | 11/1994 | | JP | 03228348 | 10/1991 |
| DE | 94 06 227 | 11/1994 | | JP | 4-732 | 1/1992 |
| DE | 195 41 334 | 9/1996 | | JP | 04130639 | 5/1992 |
| DE | 196 16 212 | 10/1996 | | JP | 04159043 | 6/1992 |
| DE | 19542955 | 5/1997 | | JP | 04206930 | 7/1992 |
| DE | 196 18 717 | 1/1998 | | JP | 05082631 | 4/1993 |
| DE | 19618717 | 1/1998 | | JP | 5-157790 | 6/1993 |
| DE | 19749687 | 5/1998 | | JP | 5157790 | 6/1993 |
| DE | 29809568 | 10/1998 | | JP | 5-166893 | 7/1993 |
| DE | 693 22 206 | 1/1999 | | JP | 5166893 | 7/1993 |
| DE | 20220754 | 5/2004 | | JP | 60-71425 | 3/1994 |
| EP | 0 087 497 | 9/1983 | | JP | 6154238 | 6/1994 |
| EP | 0230766 | 12/1985 | | JP | 7-5197 | 1/1995 |
| | | | | JP | 7005078 | 1/1995 |

| | | |
|---|---|---|
| JP | 7012871 | 1/1995 |
| JP | 7-273509 | 10/1995 |
| JP | 8035987 | 2/1996 |
| JP | 08330401 | 12/1996 |
| JP | 09127432 | 5/1997 |
| JP | 10-116866 | 5/1998 |
| JP | 10116866 | 5/1998 |
| JP | 10-339743 | 12/1998 |
| JP | 11004001 | 1/1999 |
| JP | 11023975 | 1/1999 |
| JP | 11-031724 | 2/1999 |
| JP | 2001-189285 | 7/2001 |
| JP | 2001-189378 | 7/2001 |
| JP | 2002033374 | 1/2002 |
| JP | 2002-164396 | 6/2002 |
| JP | 2002243502 | 8/2002 |
| SU | 1195402 | 11/1985 |
| SU | 1327023 | 7/1987 |
| WO | WO80/00101 | 1/1980 |
| WO | WO 80/00101 | 1/1980 |
| WO | WO 86/07493 | 12/1986 |
| WO | WO 89/04001 | 5/1989 |
| WO | WO94/10554 | 5/1994 |
| WO | WO98/07040 | 2/1998 |
| WO | WO01/07207 | 2/2001 |
| WO | WO 01/69656 | 9/2001 |
| WO | WO 2004/049395 | 6/2004 |
| WO | WO 2006/083581 | 8/2006 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1, Committee Personnel, "IRE Standards on Methods of Measuring Noise in Linear Twoports, 1959," Proc. IRE, vol. 48, pp. 60-68, Jan. 1960, pp. 32-40.
Bry, A., et al, "Bypass Capacitor for Chip Probe," IBM Technical Disclosure Bulletin, vol. 18, No. 11, Apr. 1976.
Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.
Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentaton and Measurement, Jun. 1973.
Daly, P., "Polar Geometry Waveguides by finite-element Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, 1975, pp. 17-22-17-27.
Skobern, J.R., "Subminiature High-Frequency Probe," IBM Technical disclosure Bulletin, vol. 19, No. 10, Mar. 1977.
Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertragungstechnik," Elektronik 8/ Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF), Inserts, Calibration & Check Devices, MT951, MT952, MT953 Series," Advanced Data 4T-002, Sep. 20, 1982, pp. 1-2.
Maury Microwave Corp., "Transistor Test Fixture (TTF)," MT950 Series, Advanced data 4T-001, Oct. 7, 1982.
Abbott, D.A., et al., "Automatic noise figure measurements with computer control and correction," 8054 Radio and Electronic Engineer vol. 52, Oct. 1982, pp. 468-474.
Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTT-S Digest 1987, pp. 353-356.
Izadian, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate Measurement of High-speed Package and Interconnect Parasitics," IEEE 1988 Custom Integrated Circuits Conference, pp. 23.3.1-23.3.6.
Fraser, Artur, et al., "GHz On-Silicon-Wafer Probing Calibration Methods," Paper 7.6, IEEE 1988 Bipolar Circuits & Technology Meeting, pp. 154-157.
Modolo, John A., et al, "Wafer level high-frequency measurements of photodetector characteristics," Applied Optics, vol. 27 pp. 3059-3061, Aug. 1988.
Design Technique, "Adjustable Test Fixture," 1988.
Tong, Peter R., et al., "Noise Measurements at MM-Wave Frequencies," 176 Microwave Journal 31, Jul. 1988.
Barsotti, C., et al. "New Probe Cards Replace Needle Types," Semiconductor International, Aug. 1988, pp. 98-101.
Microwave Journal, "Microwave Products," Sep. 1988, pp. 297.
Cascade Microtech Microprobe Update, "Spurious propagation, modes removed by probe absorber," Apr. 1989.
Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.
Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.
Dalman, G.C., "New Waveguide-to-Coplaner Waveguide Transition for Centimetre and Millimetre Wave Applications," Electronics Letters, Jun. 21, 1990, vol. 26, No. 13.
Cascade Microtech WPH-700 series, "Multicontact High-Speed Integrated Circuit," 1991, 700S-591.
Liu, S.M. Joseph, et al., "A New Probe for W-band On-wafer Measurements," IEEE MTT-S Digest, 1993, pp. 1335-1338.
Photo of Micromanipulator Probe Station, 1994.
Maury Microwave Corp., Transistor Test Fixture (TTF) MT950 Series, May 31, 1995, Advanced Data, 4T-0011.
Cascade Microtech, "Layout rules for WPH-900 Series probes," Application Note, 1996.
Cascade Microtech, "Air coplanar Probe Series," 1997.
Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.
"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 1 10 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurement using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W- Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.

Eric Phizicky, Philippe I.H. Bastiaens, Heng Zhu, Michael Snyder, & Stanley Fields, "Protein analysis on a proteomic scale," Nature 422, Insight: review article, Mar. 13, 2003.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures, "pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D. Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R.Y. Koyama & M. G. Buehler, "Semiconductor Measurement Technology: A Wafer Chuck for Use Between -196 and 350° C., " U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68th Street, Mercer Island, Washington 98040.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages.

Mark S. Boguski & Martin W. McIntosh, "Biomedical Informatics for proteomics," Insight: review article, Nature 422, Mar. 13, 2003, pp. 233-237.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Cascade Microtech, "Advanced On-Wafer Device Characterization Using the Summit 10500," pp. 2-20.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications-High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure For low temperature wafer probing in a moisture-free environment," 2 pages.

*Cascade Microtech, Inc.* vs. *Micromanipulator Company, Inc.,* "Deposition of Harry F. Applebay," United States District Court for the District of Oregon, Lead Case No. 97-479-AI.

Flexion Corporation, "Cryotest Station MP-3," *Cascade Microtech, Inc.* vs. *Micromanipulator Company, Inc.,* Applebay Exhibit 576, May 13, 1998, 68 pages.

Flexion Corporation, "Cryotest Station MP-3," *Cascade Microtech, Inc.* vs. *Micromanipulator Company, Inc.,* Applebay Exhibit 578, May 13, 1998, 1 page.

*Cascade Microtech, Inc.* vs. *Micromanipulator Company, Inc.,* Applebay Exhibit 572, May 13, 1998, 2 pages.

*Cascade Microtech, Inc.* vs. *Micromanipulator Company, Inc.,* Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.,* Applebay Exhibits 577A, 577B, 577C, May 13, 1998, 3 pages.

*Cascade Microtech, Inc.* vs. *Micromanipulator Company, Inc.,* Applebay Exhibits 585, May 13, 1998, 7 pages.

\* cited by examiner

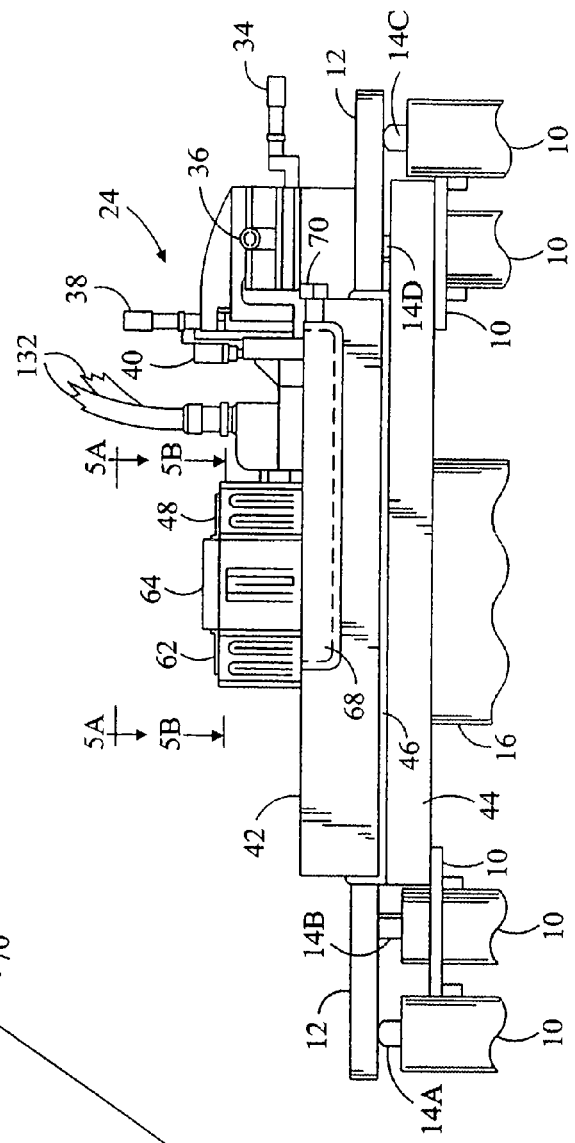
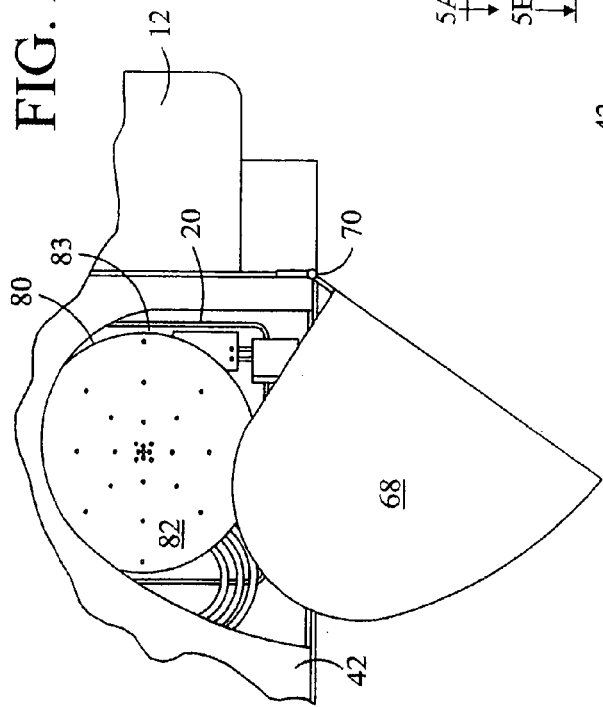
FIG. 2A  Prior Art
FIG. 1  Prior Art

INTERFACE FOR TESTING SEMICONDUCTORS

CROSS-REFERENCE TO RELATED APPLICATIONS

This application claims the benefit of U.S. Provisional App. No. 60/648,747, filed Jan. 31, 2005.

BACKGROUND OF THE INVENTION

The present invention relates to a system that includes an imaging device for effectively positioning a probe for testing a semiconductor wafer.

Processing semiconductor wafers include processes which form a large number of devices within and on the surface of the semiconductor wafer (hereinafter referred to simply as "wafer"). After fabrication these devices are typically subjected to various electrical tests and characterizations. In some cases the electrical tests characterize the operation of circuitry and in other cases characterize the semiconductor process. By characterizing the circuitry and devices thereon the yield of the semiconductor process may be increased.

In many cases a probe station, such as those available from Cascade Microtech, Inc., are used to perform the characterization of the semiconductor process. With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3A and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3A, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3A and 3B, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3A the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110*b* are connected in parallel to a connector plate 116 similarly matingly connected detachably to element 81. The connector elements pass freely through a rectangular opening 112*a* in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122*a*, 124*a* are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108*a* or 110*a*, while the other conductor connects the intermediate (guard) connector element of a respective connector 122 or 124 with a respective connector element 108*b*, 110*b*. U.S. Pat. No. 5,532,609 discloses a probe station and chuck and is hereby incorporated by reference.

In order to position probes for testing semiconductors, typically on a conductive pad, a microscope may be used. The process for positioning the microscope on the semiconductor is time consuming and laborious. A wide angle field of view objective lens for the microscope is selected and installed. Then the probe is brought into the general field of view of the microscope with the semiconductor thereunder with the objective lens focused on the upper region of the probe. Hence, the upper region of the probe farther away from the probe tip is generally in focus. The lower regions of the probe and the probe tip are generally not in focus due to the limited depth of field of the objective lens. Also, at this point only the larger features of the semiconductor are discernable. The zoom of the microscope may be increased by the operator and the microscope shifted to focus on a further distant part of the probe which provides a narrower field of view so that a middle region of the microscope is in focus. Hence, the upper region of the probe and the probe tip region are generally not in focus when viewing the middle region of the probe due to the limited depth of field of the objective lens. Also, at this point smaller regions of the semiconductor are discernable. The zoom of the microscope may be increased by the operator and the microscope shifted to focus on the probe tip which provides an increasingly narrower field of view so that the probe tip region is generally in focus together with the corresponding devices under test. The lower regions of the probe and the upper regions of the probe are generally not in focus when viewing the probe tip region of the probe due to the limited depth of field of the objective lens.

While it would appear to be straightforward to position a probe tip on a desirable device under test, it turns out that this is a burdensome and difficult task. Often when zooming the microscope the probe goes out of focus and when the microscope is refocused the probe is not within the field of view. When this occurs there is a need to zoom out to a wider field of view and restart the process. Also, when there are several devices in close proximity to one another and a wide field of view is observed, it is difficult to discern which device under test the probe tip is actually proximate. As the microscope is zoomed and an increasingly narrow field of view it tends to be difficult to determine which device the probe is actually testing among a set of closely spaced devices. In many cases, the operator will desire to use a higher magnification microscope, which requires the microscope to be retracted, the objective lens changed, and the microscope moved back into position. Unfortunately, if any movement of the wafer relative to the probe occurs due to even slight vibration, the probe will not longer be in close alignment. Thus, the objective lens will typically be changed back to one with a lower magnification and the process started all over again.

BRIEF DESCRIPTION OF THE SEVERAL VIEWS OF THE DRAWINGS

FIG. 1 is a partial front view of an exemplary embodiment of a wafer probe station constructed in accordance with the present invention.

DETAILED DESCRIPTION OF PREFERRED EMBODIMENT

Figure 2:
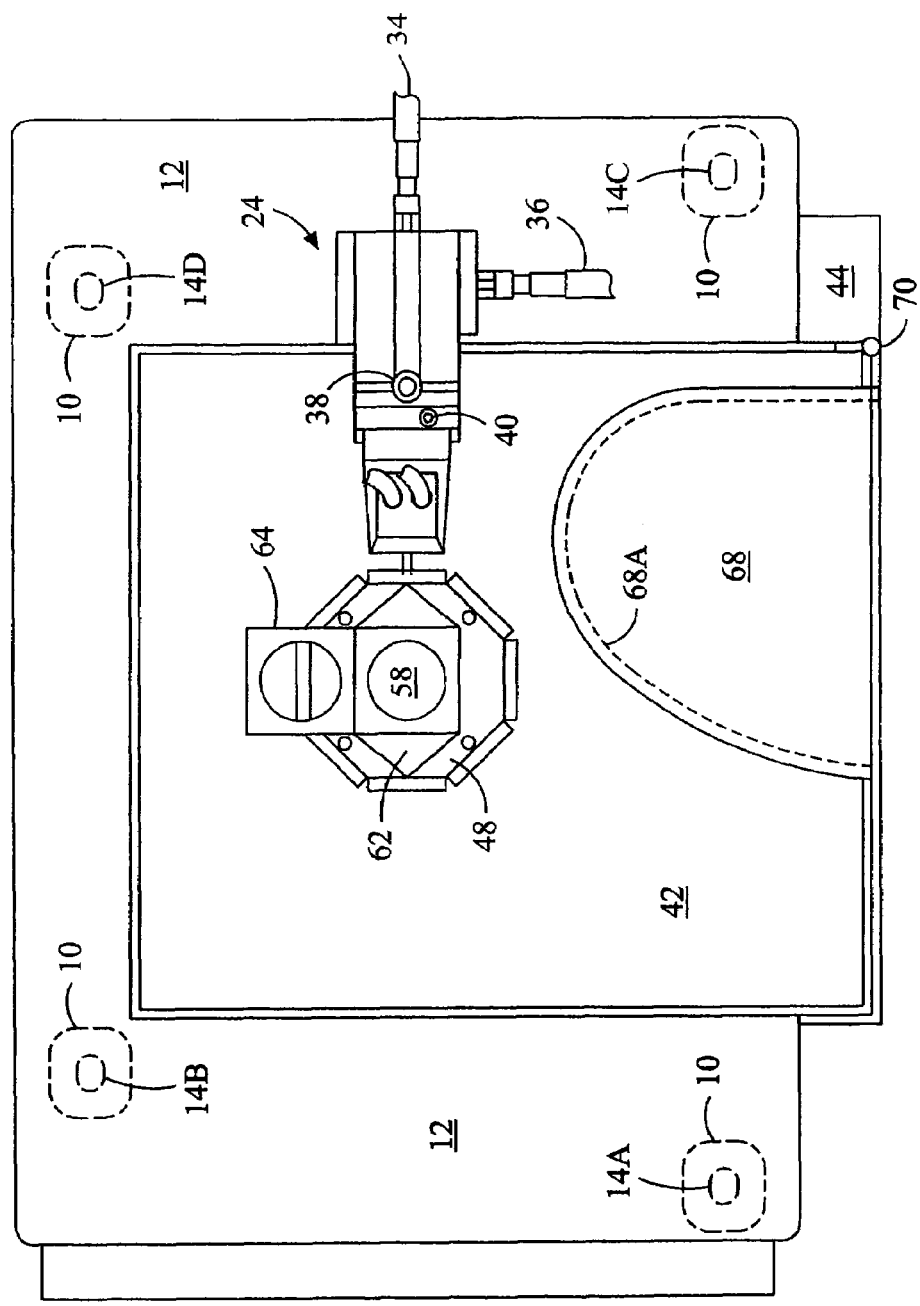
FIG. 2 is a top view of the wafer probe station of FIG. 1.
Figure 2B:
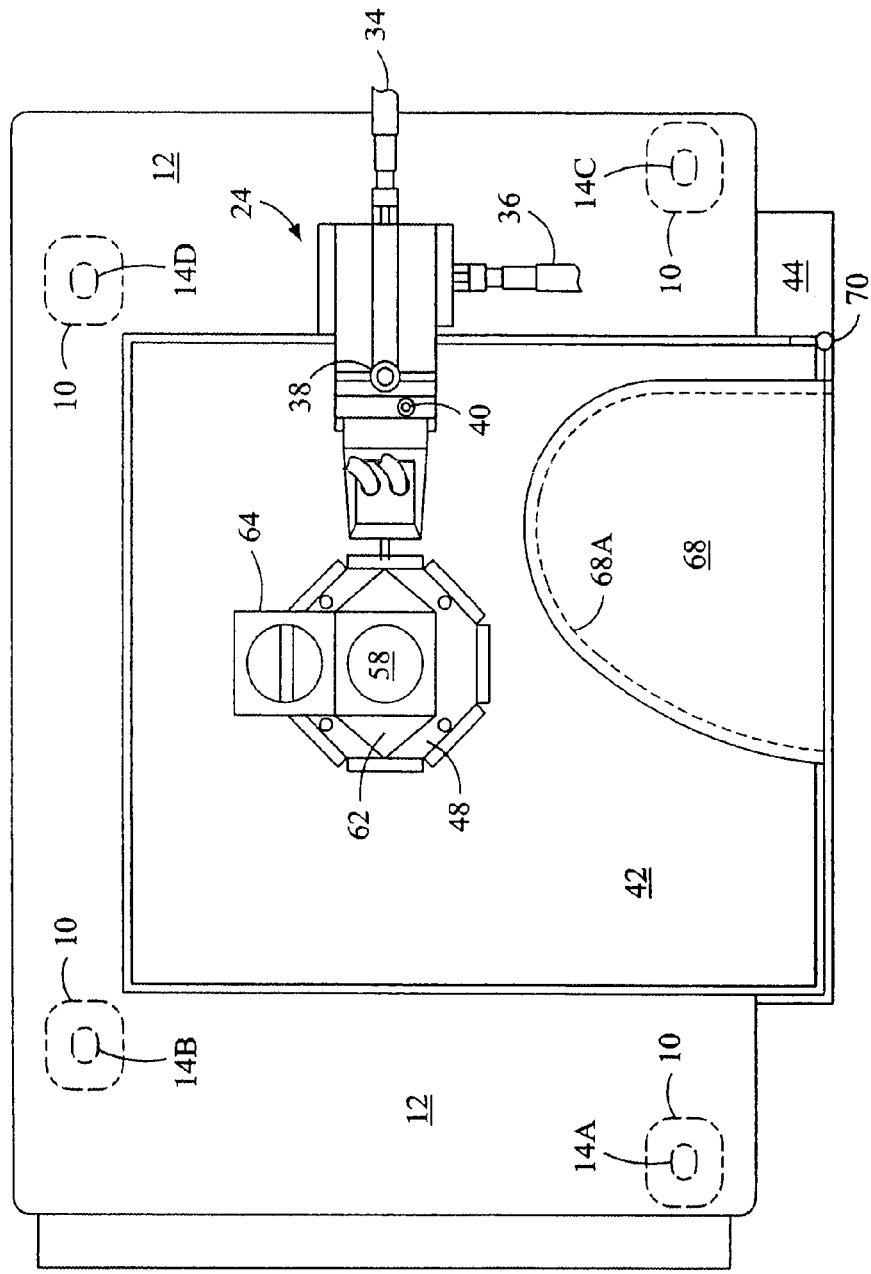
FIG. 2A is a partial top view of the wafer probe station of FIG. 1 with the enclosure door shown partially open.
Figure 3:
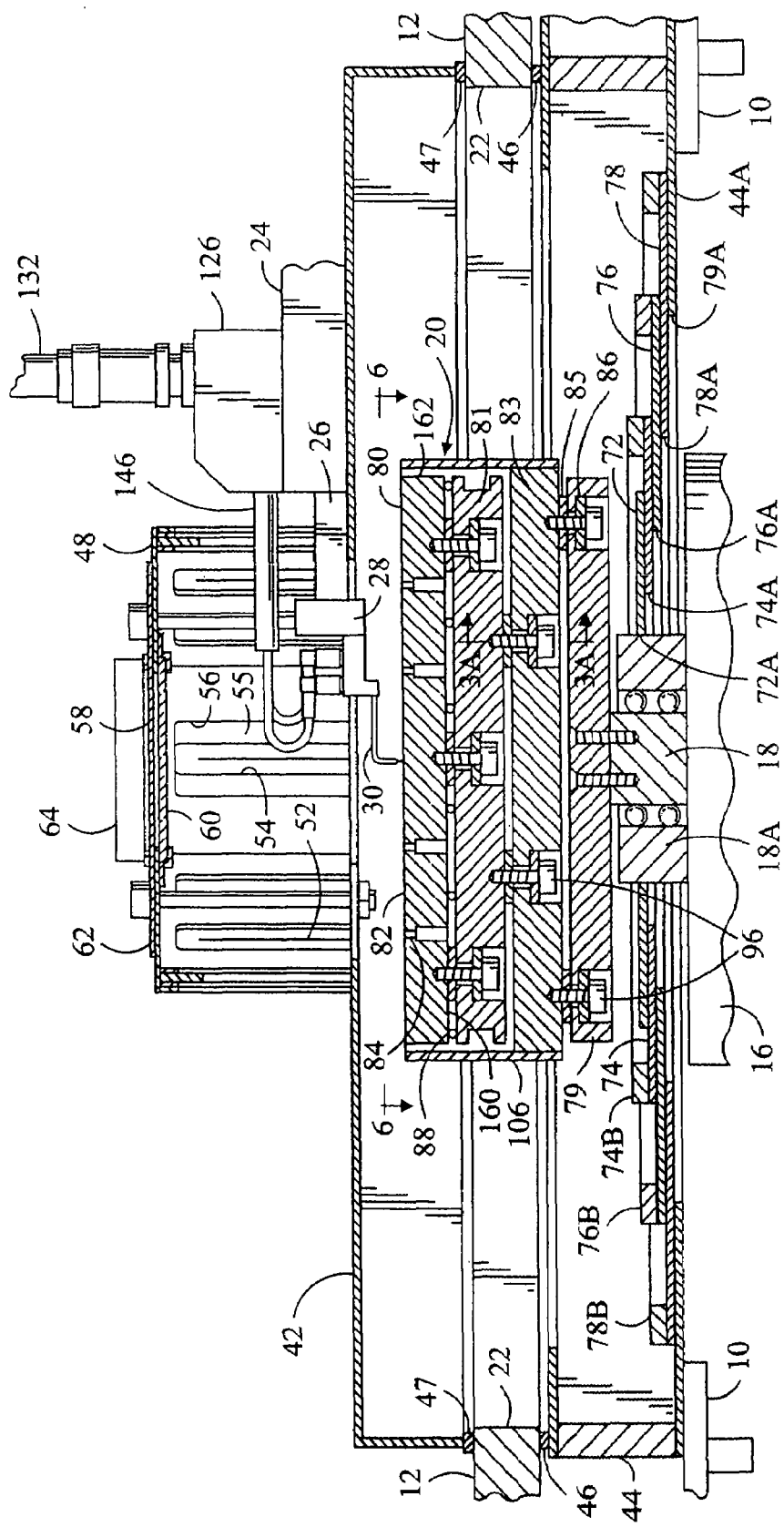
FIG. 3A is a partially sectional and partially schematic front view of the probe station of FIG. 1.
FIG. 3B is an enlarged sectional view taken along line 3B-3B of FIG. 3A.
Figures 3A, 3B:
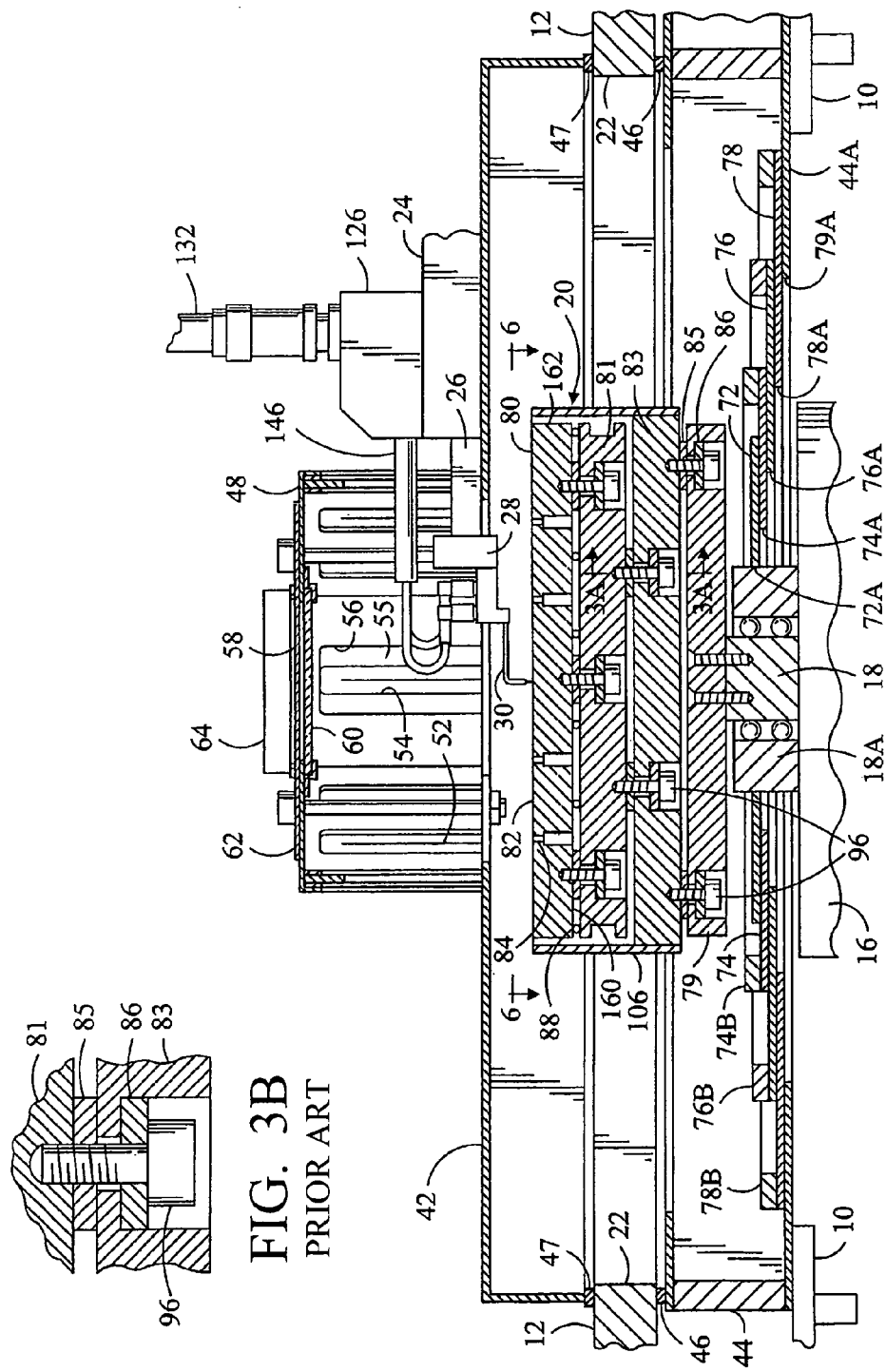
Figure 4:
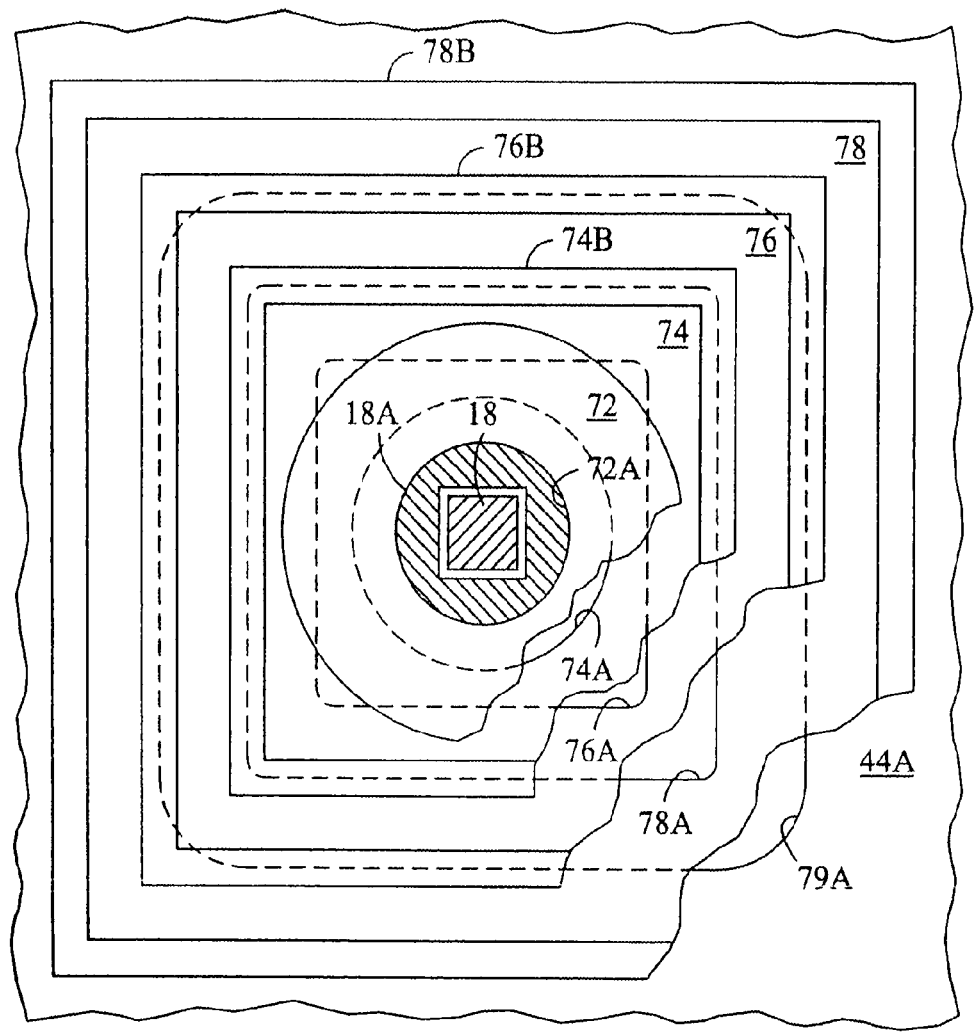
FIG. 4 is a top view of the sealing assembly where the motorized positioning mechanism extends through the bottom of the enclosure.
Figure 5A:
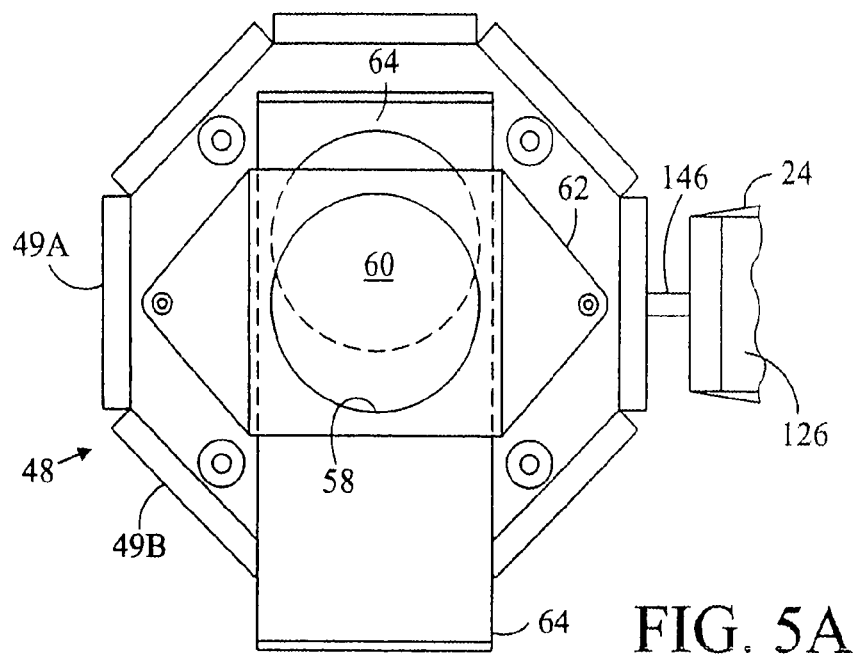
FIG. 5A is an enlarged top detail view taken along line 5A-5A of FIG. 1.
Figure 5B:
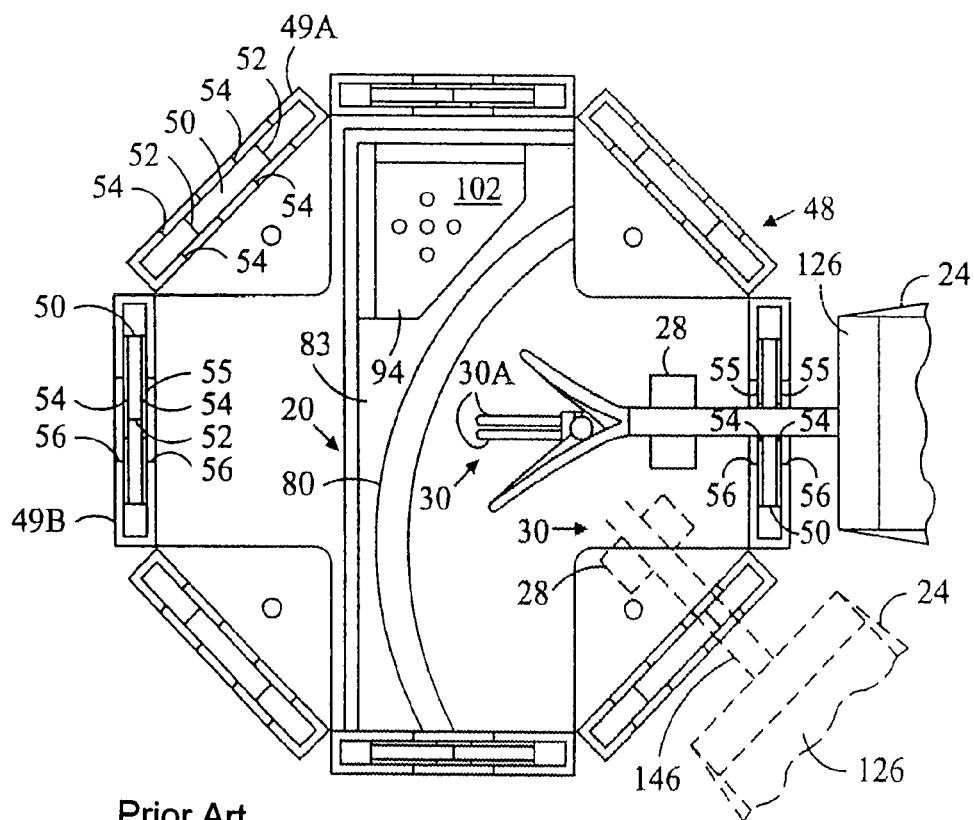
FIG. 5B is an enlarged top sectional view taken along line 5B-5B of FIG. 1.
Figure 6:
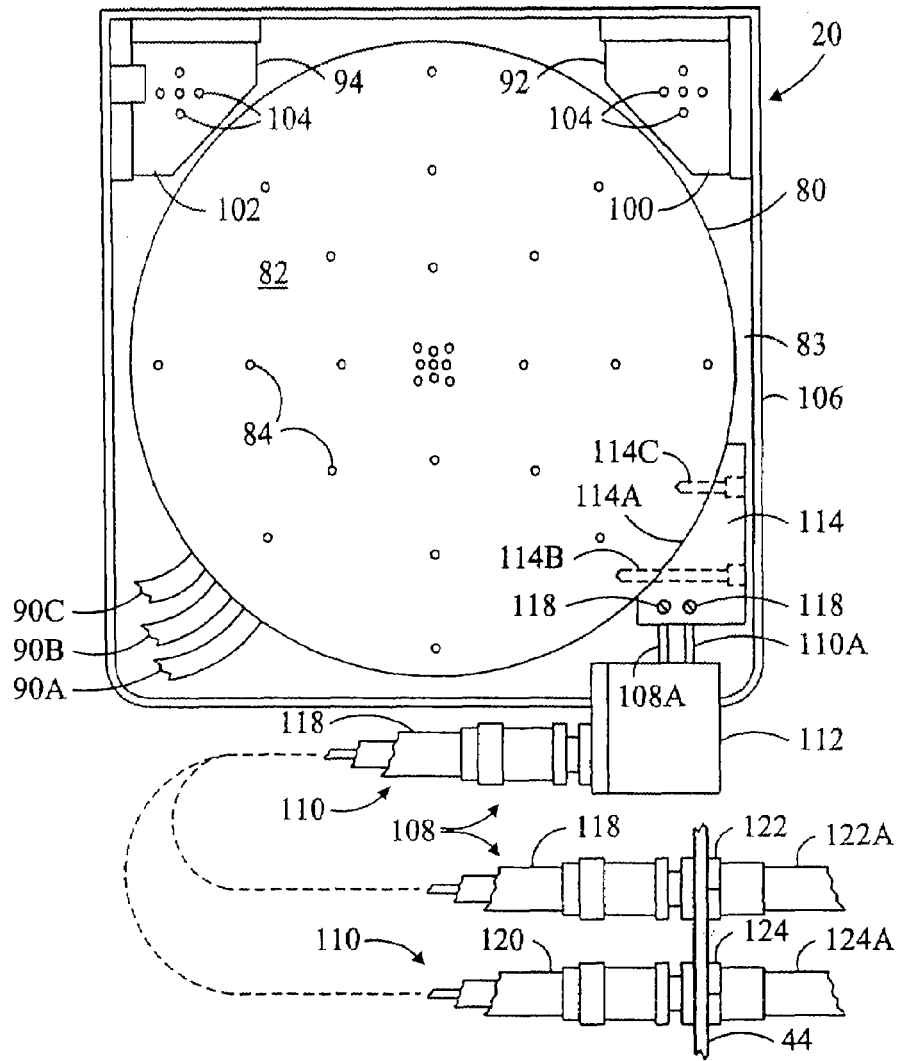
FIG. 6 is a partially schematic top detail view of the chuck assembly, taken along line 6-6 of FIG. 3A.
Figure 7:
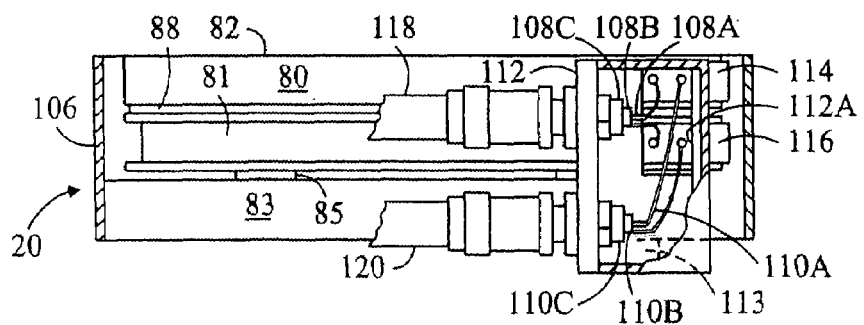
FIG. 7 is a partially sectional front view of the chuck assembly of FIG. 6.
Figure 8:
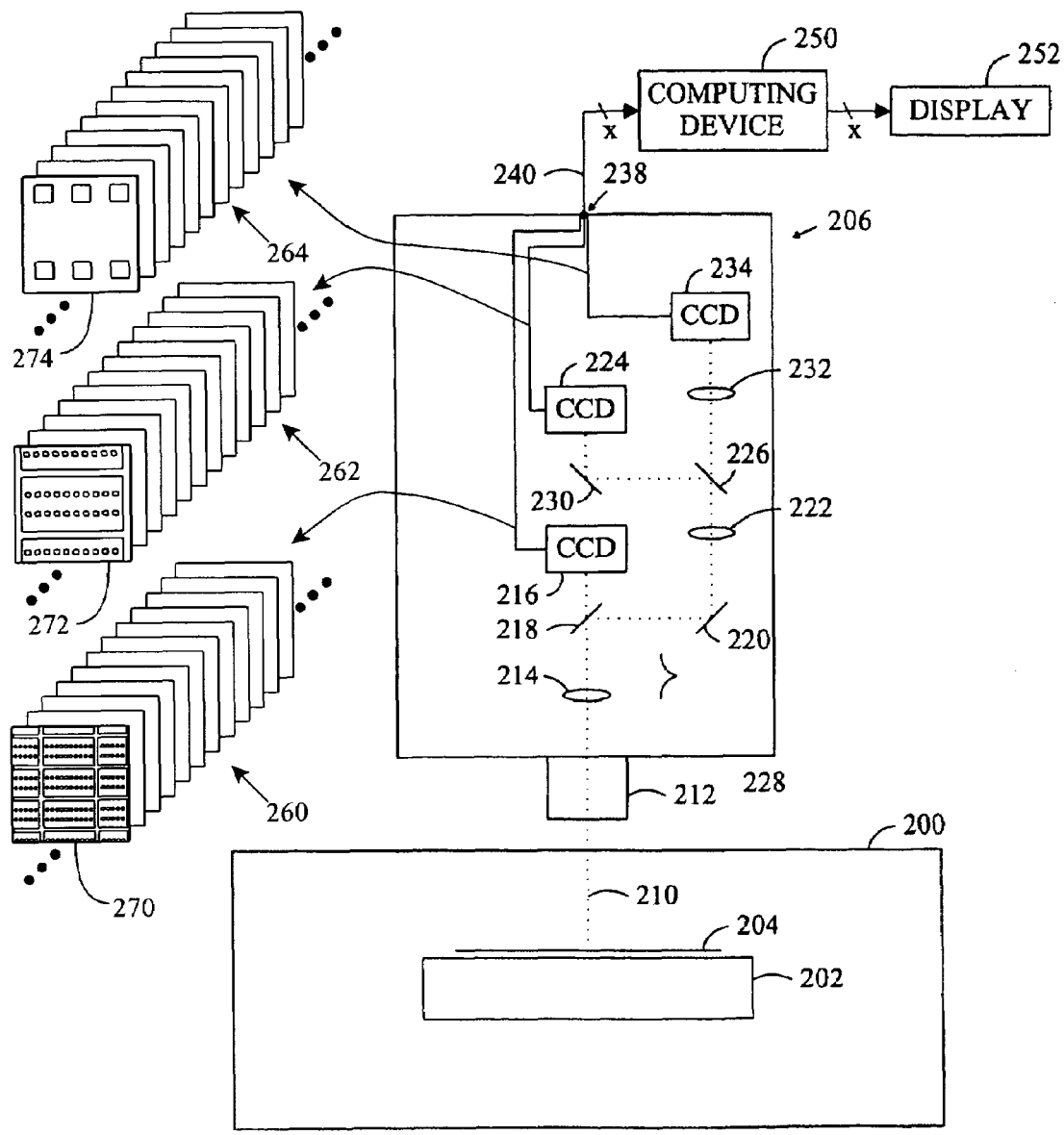
FIG. 8 illustrates a probing system together with a microscope.

Referring to FIG. 8, a probing system may include a probing environment 200 having a support 202 for a wafer 204 together with a microscope 206. The microscope 206 preferably includes a single optical path 210 that passes through an objective lens 212. The optical path may pass through a first lens 214 which images the light from the device under test on a first imaging device 216, such as a charge coupled device. An optical splitting device 218 may be used to direct a portion 220 of the light from being imaged on the first imaging device 216. The light 220 may be reflected by a mirror 221 and pass through a second lens 222. An optical splitting device 226 and mirror 230 may be used to direct a portion 228 of the light being imaged on a second imaging device 224. Accordingly, the light from the second lens 222 images the light on a second imaging device 224. The light passing through the optical splitting device 226 passes through a lens 232 and is imaged on a third imaging device 234.

The first imaging device 216 images the device under test at a first magnification based upon the objective lens 212 and the first lens 214. Normally the first imaging device 216 images 270 a relatively wide field of view. The second imaging device 224 images the device under test at a second magnification based upon the objective lens 212, the first lens 214, and the second lens 222. Normally the second imaging device 216 images 272 a medium field of view, being of a greater magnification than the relatively wide field of view of the first imaging device 216. The third imaging device 234 images the device under test at a third magnification based upon the objective lens 212, the first lens 214, the second lens 222, and the third lens 232. Normally the third imaging device 234 images 274 a narrow field of view, being of a greater magnification than the medium field of view of the second imaging device 224.

With a wide field of view for the first imaging device 216, the large features of the device under test may be observed. With the narrower field of view of the second imaging device 224, the smaller features of the device under test may be observed. With the increasingly narrower field of view of the third imaging device 234, the increasingly smaller features of the device under test may be observed. As it may be observed, the three imaging devices provide different fields of view, multiple images of overlapping regions, of the same device. In some embodiments, three or more imaging devices may be used. In other embodiments, two or more imaging devices may be used. In yet other embodiments, a single imaging device may be used. In some cases, the microscope with a single imaging device may include mechanisms to provide variable magnification. Also, in some cases the microscope with a single imaging device may use all of the imaging sensor for the wide field of view, a smaller region of the imaging sensor for a narrower field of view, and so forth.

The microscope 206 includes an output 238 connected to a cable 240, such as a gigabit network cable. Each of the imaging devices 216, 224, 234, provides a video signal (comprising a sequence of sequential frames in most cases) to the cable 240. The multiple video signals in the cable 240 are preferably simultaneous video sequences 260, 262, 264, respectively, captured as a series of frames, for examples frames or images 270, 272, 274, from each of the respective imaging devices 216, 224, 234. In addition, the video signals are preferably simultaneously transmitted, albeit they may be multiplexed within the cable 240. In some embodiments the microscope 206 may have multiple outputs and multiple cables, with one for each imaging device and video signal, it is preferable that the microscope 206 includes a single output for the video signals.

The multiple video signals transmitted within the cable 240 are provided to a computing device 250. The input feeds in many cases are provided to a graphics card connected to an AGP interconnection or PCI interconnection. Accordingly, the computing device receives a plurality of simultaneous video streams. Each of the video streams may be graphically enhanced, as desired, such as by sharpening and using temporal analysis to enhance details. The three video feeds may be combined into a single composite video feed with a portion of each video feed being illustrated on the composite video feed and provided to a single display for presentation to the viewer. In this case, each of the viewers would be able to observe multiple video feeds on a single display. The video signal may likewise be provided to multiple different displays.

Figure 9:
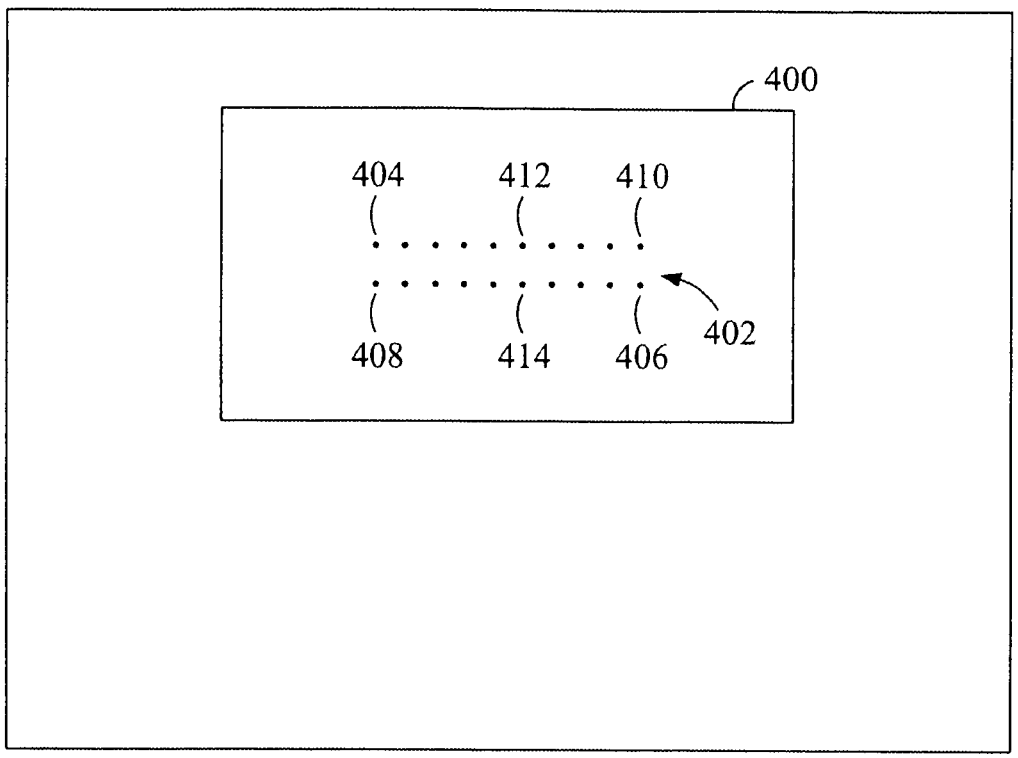
FIG. 9 illustrates a pattern of devices under test.

Referring to FIG. 9, it is desirable to view a region of the video 400 of the image that includes a set of probe pads 402 thereon. Typically, when using a probe card or one or more probes, a set of needles or contacts are arranged with a pattern matching that of the probe pads 402. Typically the operator aligns a needle with the one of the pads, such as the upper left pad 404. Then the operator aligns a needle with one of the other contacts, such as the lower right pad 406. Then the operator aligns the lower left needle 408 and the upper right needle 410. The operator may likewise align the central needles with an upper central pad 412 and a lower central pad 414. Between each alignment of the needles to the contact pads, the microscope is typically moved so that suitable observations may be observed. Unfortunately, the x, y, z, and theta adjustments of the probe card (or device under test) necessary to align one of the needles results in movement of one of the other needles to a potion off a previously aligned pad. Accordingly, each of the needles typically needs to be checked and re-checked several times in order to ensure proper alignment.

Figure 10:
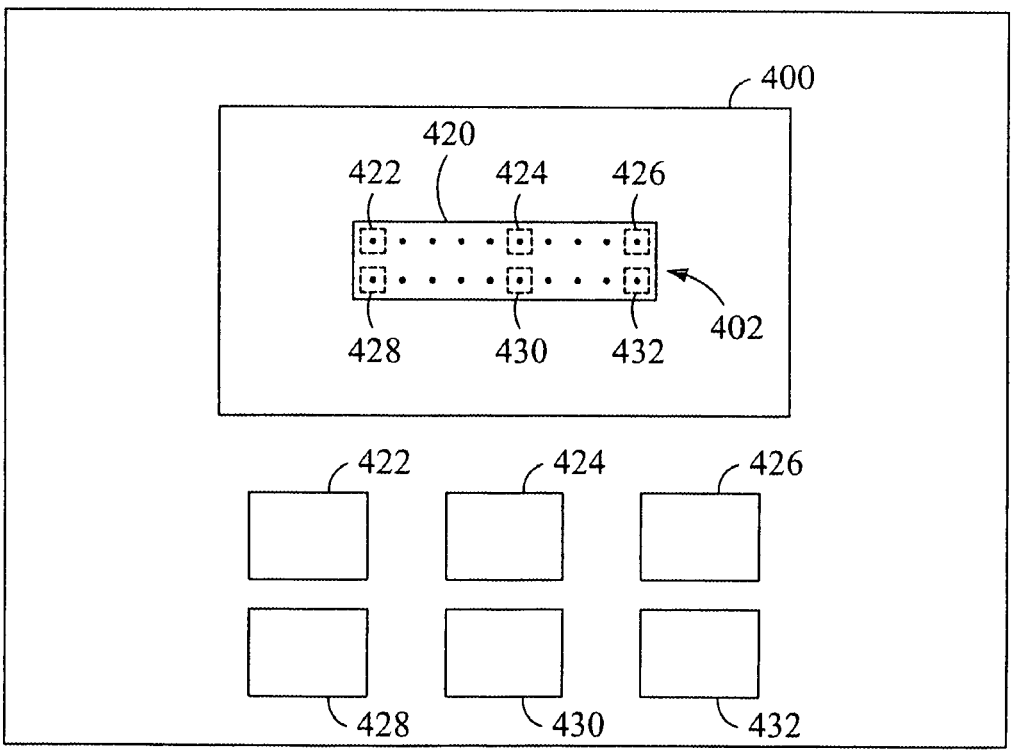
FIG. 10 illustrates a pattern of devices under test and a set of automatically populated windows.

Referring to FIG. 10, to decrease the frustration with the alignment of the needles (or contacts) with the devices under test, the user may select a region including the devices under test by drawing a box 420 around the desired devices under test 402. The box 420 is preferably indicated by selecting a pair of opposing corners closely surrounding the devices under test 402. Based upon the box 420 an upper left region 422, a lower left region 428, an upper right region 420, and a lower right region 432 may be automatically selected free from user selection. These regions 420, 422, 428, and 432 are provided in respective larger windows so that the operator can more easily view the respective regions. The larger windows are likewise arranged in a manner consistent with the devices under test so that each region is more easily identified.

The needles of the probes or probe card can be aligned with the devices under test 402 while viewing the larger windows which easily illustrate the alignment of the probes without the need to move the microscope. In this manner, the operator can view the probes at all four corners.

In order to provide a greater indication of the angular relationship of the probe needles with respect to the alignment of the devices under test, it is preferable that the system provides indications of a central region, such as regions 424 and 430. In this manner, the operator can view the probes at all four corners and the central regions also.

The system may permit the user to modify the size and location of each of the regions 422, 424, 426, 428, 430, 432. Other configurations and selections may likewise be automatically populated, as desired. The video may originate with a single imaging device or may be displayed from multiple different imaging devices to achieve increased image quality. When operating the device, typically the probe needles comes into view in one or more of the windows. The user may adjust the x, y, z, and theta of the probe card so that the needles are aligned on the pads shown in the larger windows. In this manner, the user probe is effectively aligned without the need to move the microscope back and forth.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probing system for a device under test comprising:
   (a) an objective lens sensing said device under test;
   (b) an imaging device sensing a first video sequence including multiple frames of an overlapping region of said device under test;
   (c) providing a video signal to a display including said multiple frames of said overlapping region of said device under test;

(d) an operator indicating a region of said video signal of devices under test and said system in response presenting an enlarged view of a plurality of different regions of said device under test in a plurality of windows free from user input, where said region and said plurality of different regions are simultaneously displayed on said display.

2. The system of claim 1 wherein said plurality of windows includes at least four windows.

3. The system of claim 2 wherein said windows are in a rectangular arrangement.

4. The system of claim 3 wherein said operator indicating is a rectangular region.

5. The system of claim 4 wherein said at least for windows are generally at the corners of said rectangular region.

6. The system of claim 2 wherein said plurality of windows includes at least six windows.

7. The system of claim 6 wherein at least two of said windows are between respective pairs of the other windows.

8. A method for displaying video for a probing system for a device under test comprising:
   (a) receiving a video signal of a device under test including multiple frames of overlapping regions of said device under test;
   (b) presenting said video signal in a first window on a display including said multiple frames of said overlapping regions of said device under test;
   (c) an operator indicating a region of said video signal of devices under test and said system in response presenting an enlarged view of a plurality of different regions of said device under test in a plurality of windows free from user input, where said region and said plurality of different regions are simultaneously displayed on said display.

9. The method of claim 8 wherein said plurality of windows includes at least four windows.

10. The method of claim 9 wherein said windows are in a rectangular arrangement.

11. The method of claim 10 wherein said operator indicating is a rectangular region.

12. The method of claim 11 wherein said at least for windows are generally at the corners of said rectangular region.

13. The method of claim 9 wherein said plurality of windows includes at least six windows.

14. The method of claim 13 wherein at least two of said windows are between respective pairs of the other windows.

* * * * *